(12) United States Patent
Aoki et al.

(10) Patent No.: US 8,413,953 B2
(45) Date of Patent: Apr. 9, 2013

(54) POLYMER ACTUATOR, AND VALVE AND SHAFT-SEALING STRUCTURE EACH USING THE SAME

(75) Inventors: Kazuhiro Aoki, Yamanashi (JP);
Tomoya Yamasaki, Yamanashi (JP);
Chikashi Gomi, Yamanashi (JP)

(73) Assignee: Kitz Corporation, Chiba (JP)

( * ) Notice: Subject to any disclaimer, the term of this patent is extended or adjusted under 35 U.S.C. 154(b) by 0 days.

(21) Appl. No.: 12/866,123

(22) PCT Filed: Dec. 17, 2009

(86) PCT No.: PCT/JP2009/006948
§ 371 (c)(1),
(2), (4) Date: Aug. 4, 2010

(87) PCT Pub. No.: WO2010/070907
PCT Pub. Date: Jun. 24, 2010

(65) Prior Publication Data
US 2010/0313983 A1 Dec. 16, 2010

(30) Foreign Application Priority Data
Dec. 18, 2008 (JP) .................................. 2008-322573

(51) Int. Cl.
*F16K 31/02* (2006.01)
(52) U.S. Cl.
USPC ....................................... 251/129.06; 137/831
(58) Field of Classification Search .................. 310/307, 310/309; 251/129.01, 129.06
See application file for complete search history.

(56) References Cited

U.S. PATENT DOCUMENTS

| | | | | |
|---|---|---|---|---|
| 5,977,685 A | * | 11/1999 | Kurita et al. | 310/311 |
| 6,017,016 A | * | 1/2000 | Jackson | 251/129.06 |
| 2007/0148025 A1 | | 6/2007 | Higashi et al. | |
| 2008/0204909 A1 | | 8/2008 | Shiota et al. | |

FOREIGN PATENT DOCUMENTS

| | | |
|---|---|---|
| JP | 3501216 | 12/2003 |
| JP | 2005-171870 | 6/2005 |
| JP | 2007-120737 | 5/2007 |
| JP | 2008-245509 | 10/2008 |
| JP | 2008-253058 | 10/2008 |

OTHER PUBLICATIONS

International Search Report issued Mar. 23, 2010 in International (PCT) Application No. PCT/JP2009/006948.

* cited by examiner

*Primary Examiner* — John K Fristoe, Jr.
*Assistant Examiner* — Kevin E Lynn
(74) *Attorney, Agent, or Firm* — Wenderoth, Lind & Ponack, L.L.P.

(57) ABSTRACT

A polymer actuator is capable of being utilized for any of various drive sources, and the amount of deformation of the polymer actuator can particularly be used also for a valve or shaft-sealing device. The polymer actuator includes a power driver deformed upon receiving electro stimuli and electrodes disposed on the upper and lower surface sides of the power driver in an opposite manner for applying positive and negative electro stimuli to the power driver in a planar fashion. The electrodes have different stimuli application regions to have different electrical field distributions for causing distribution of stress generated in the power driver to be eccentrically located on one of positive and negative sides, thereby bending and deforming the power driver onto a side on which the opposite stimuli application regions do not exist.

10 Claims, 24 Drawing Sheets

Fig. 1
(a)
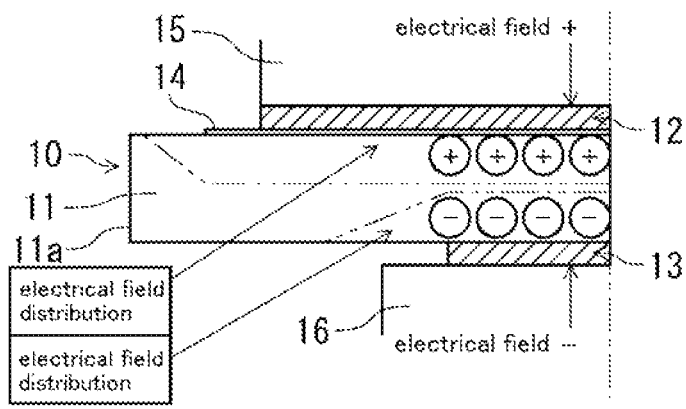
(b)
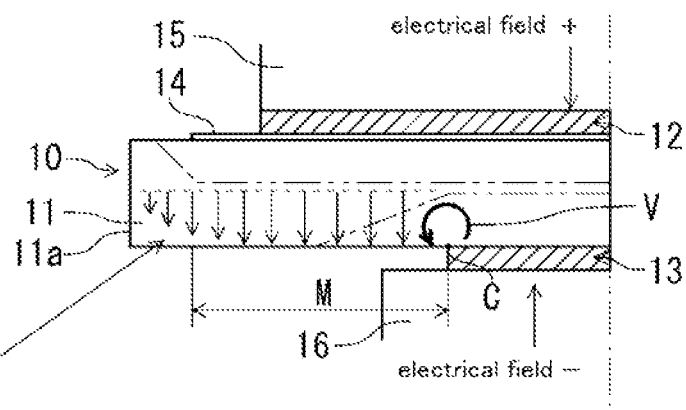
(c)
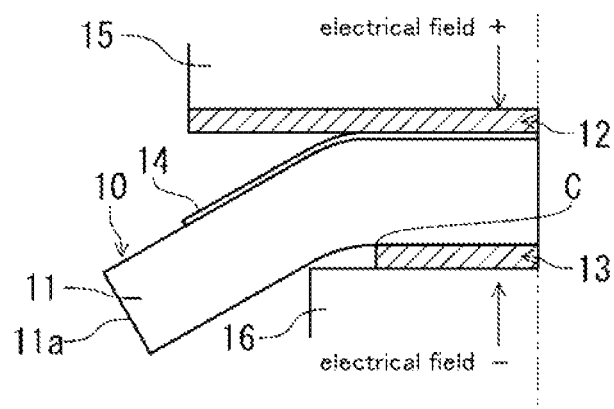

| kind of polymer material | mode of change | device movement | power source | behavior of material |
|---|---|---|---|---|
| electro stimuli-responsive polymer material | deformation | NC | ON | |
| | | | OFF | |

Fig. 14
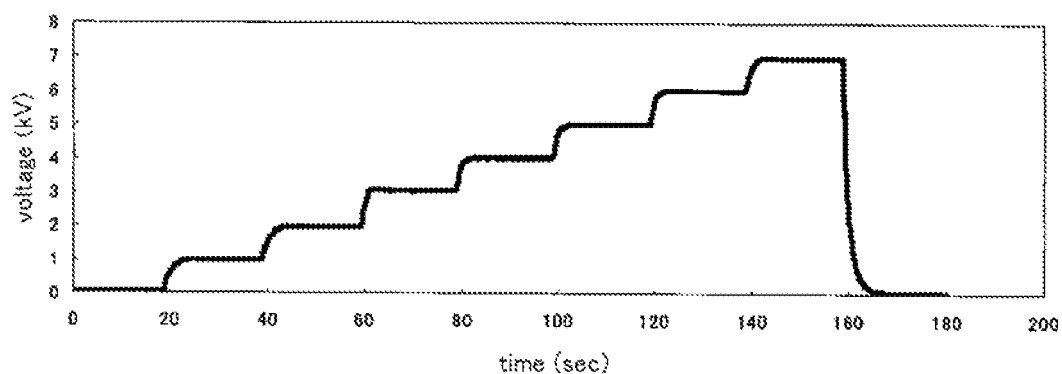
(a)
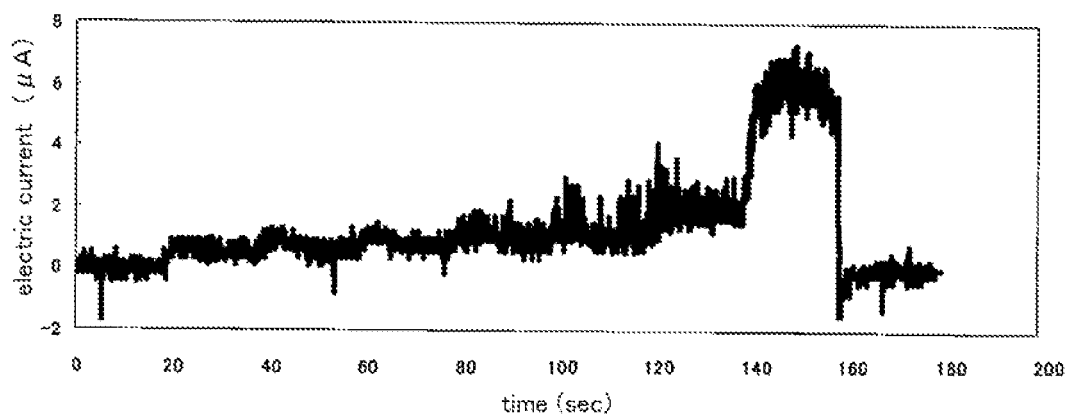
(b)
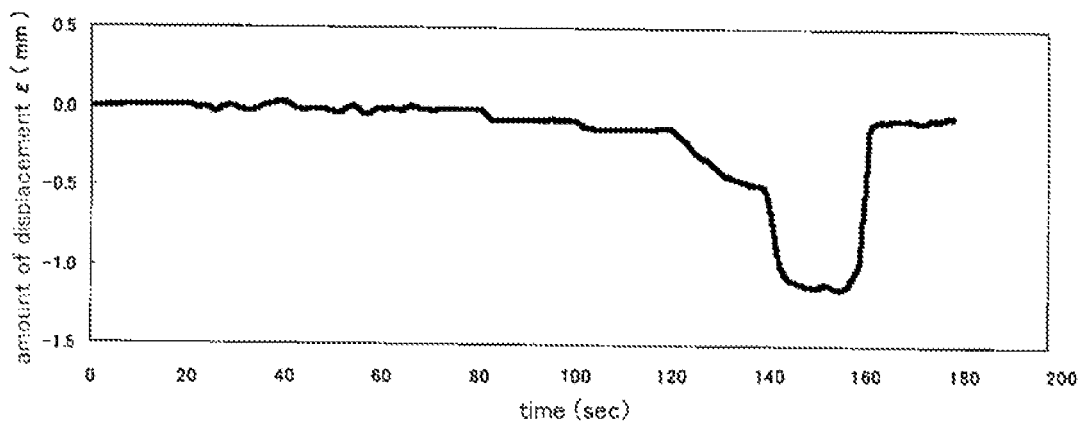
(c)

Fig. 15
(a)
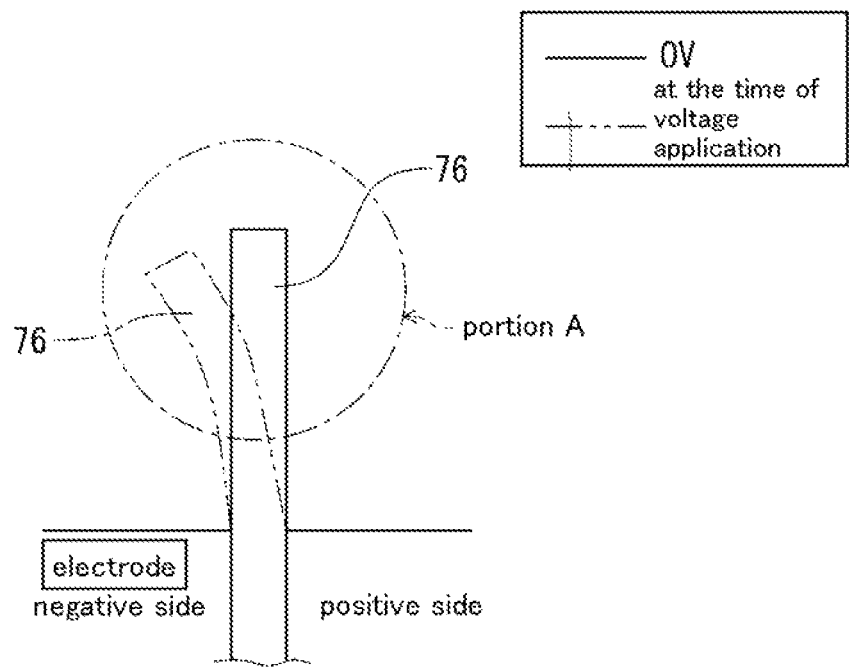
(b)
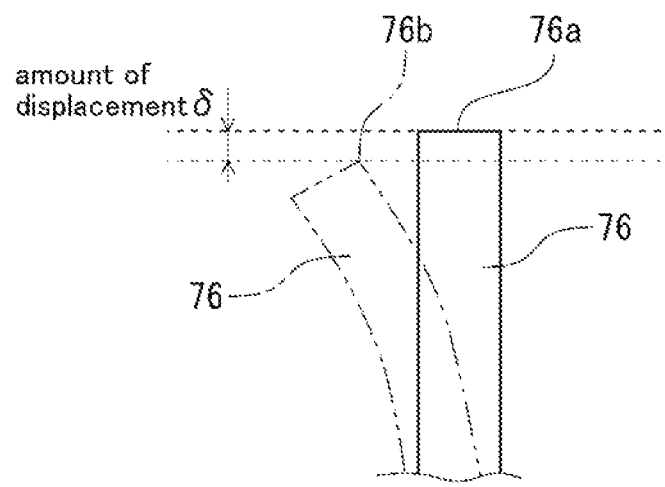

Fig. 24
(a)
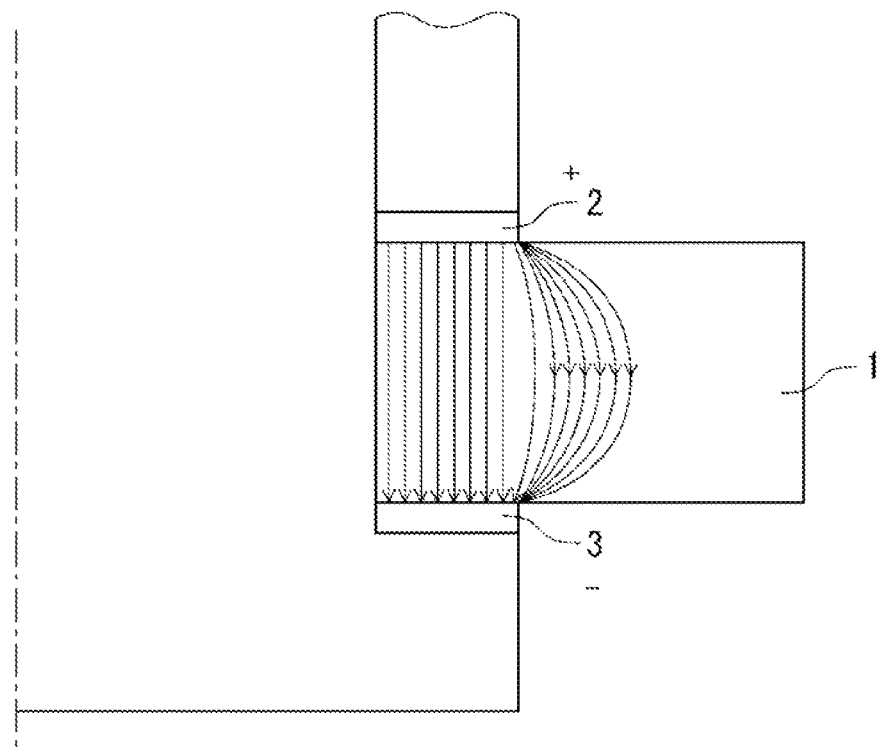
(b)
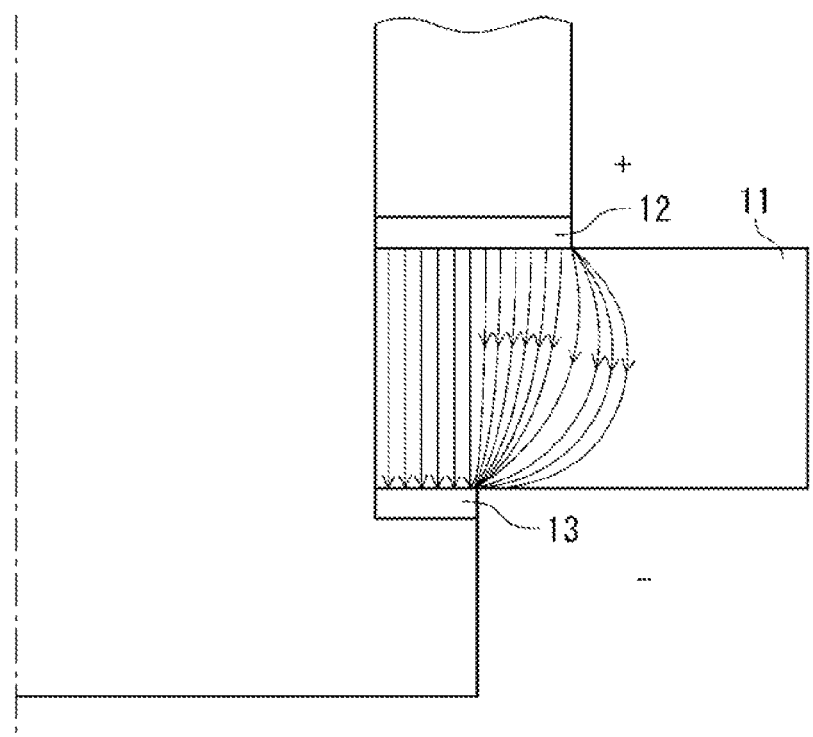

Fig. 25
(a)
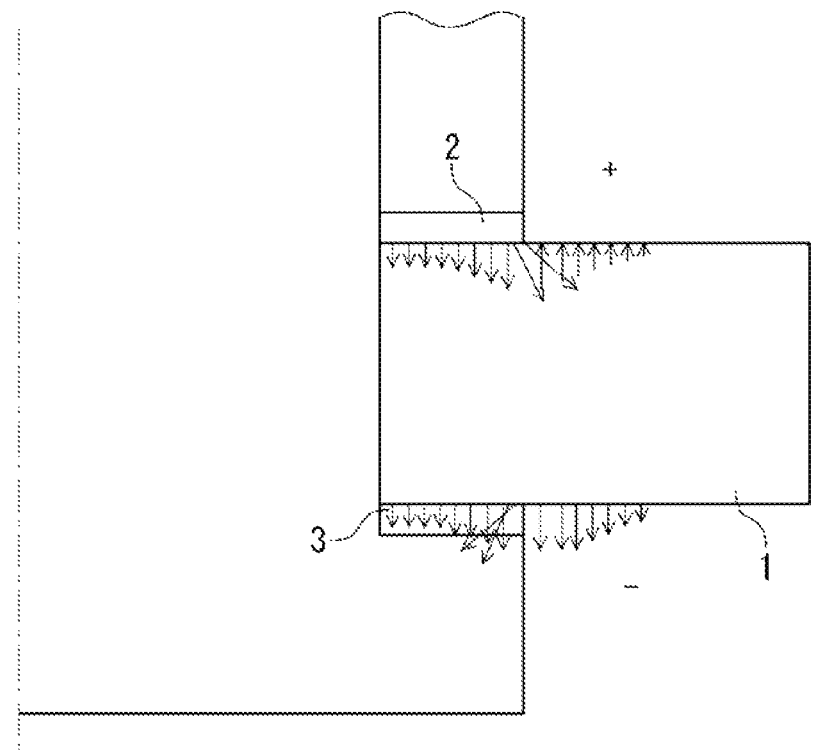
(b)
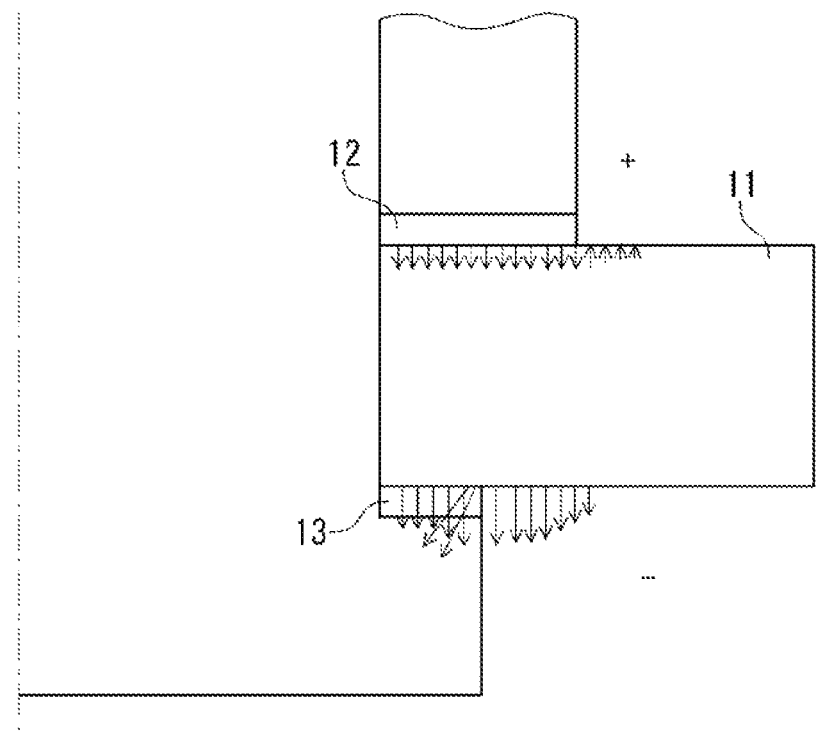

Fig. 26
(a)
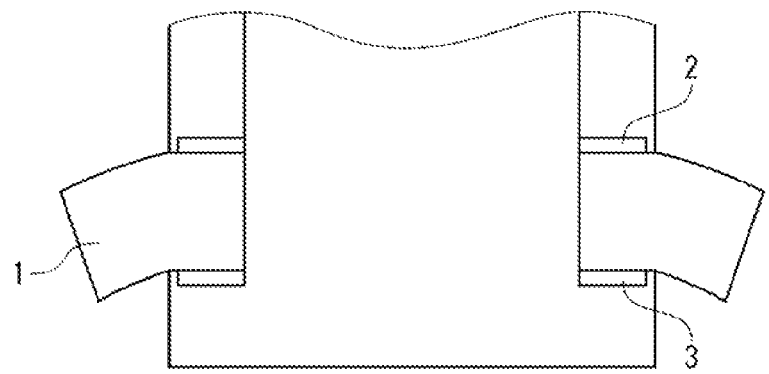
(b)
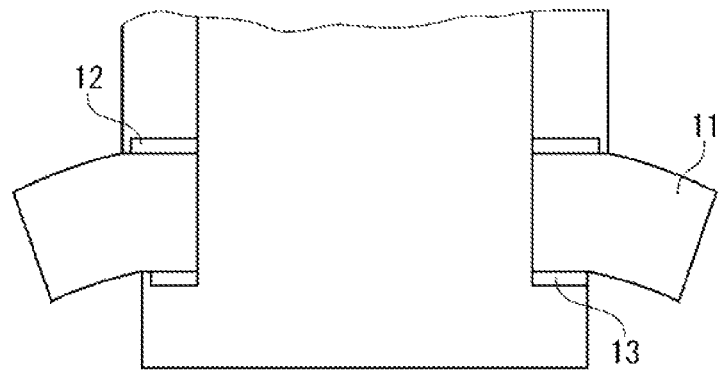
Fig. 27
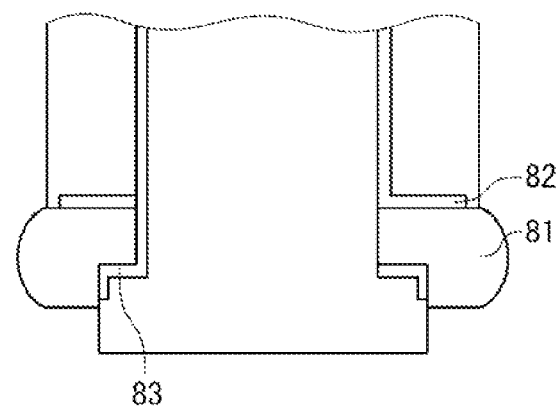

Fig. 30
(a)
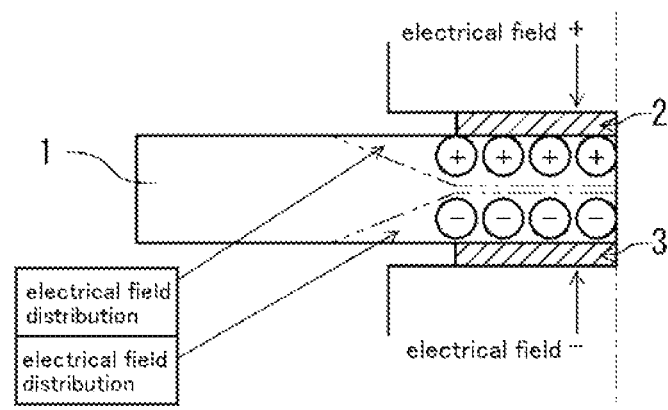
(b)
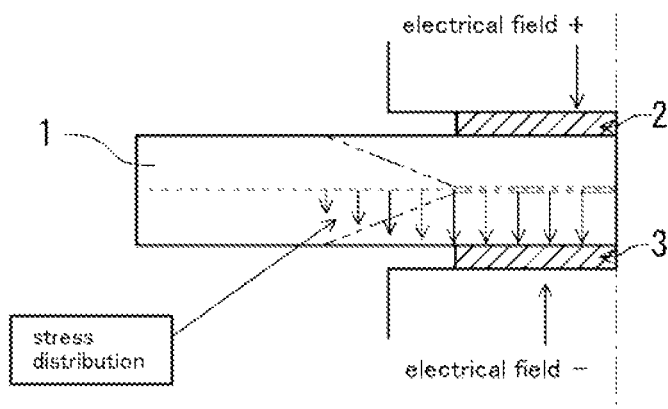
(c)
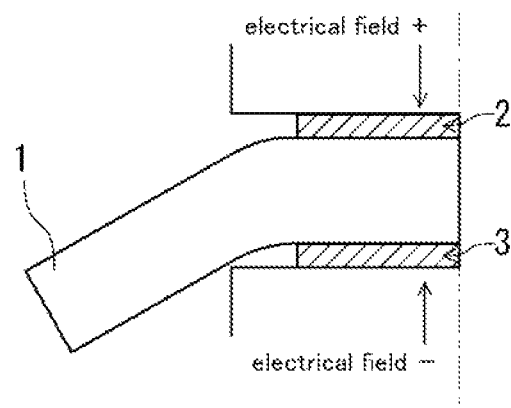

POLYMER ACTUATOR, AND VALVE AND SHAFT-SEALING STRUCTURE EACH USING THE SAME

TECHNICAL FIELD

The present invention relates to a polymer actuator using a polymer material and particularly to a valve and a shaft-sealing structure suitable for opening and closing of a flow passage or control of a flow rate to using the polymer actuator.

BACKGROUND ART

In the case of sealing a fluid at all times for controlling a flow passage within a container, for example, a shaft-sealing device using a sealing member has heretofore been utilized in general. As the sealing member in the shaft-sealing device, for example, an annular O-ring or packing substantially circular in cross section has been used for sealing a wide variety of fluids, such as air, water, oil and gas. Since the sealing member has a main function to seal a fluid, it is required to have high sealing performance.

For this reason, the sealing member is generally attached to a shaft that is a member on one side of a shaft-sealing device, or formed within a single plane in the radial direction of a hole and attached axially to a groove substantially rectangular in cross section, and has a crushing allowance compressed by the shape of the groove when fulfilling its function by the pressure of contact with a member on the other side of the shaft-sealing device. The O-ring, for example, is compressed by the crushing allowance to induce a repulsive force, and the sealability thereof with contact surface pressure by this repulsive force is achieved to attain shaft sealing.

In addition, since the sealing member is generally made of any of various synthetic rubber materials exhibiting appropriate compression stress within a range not inducing any excessive deformation, it is required to particularly have prescribed low-compression permanent distortion and further satisfy characteristics including antiweatherability, wear resistance, heat resistance, cold resistance, oil resistance and chemical resistance. Furthermore, since the sealing member is utilized for shaft-sealing devices in a wide variety of fields including the fields of automobiles, construction machines, aircraft, office automation equipment and industrial instruments, for example, materials are selected in accordance with the individual fields (intended purposes) to make the crushing allowance appropriate and, even in the case of being used in a kinetic state in which a shaft-sealing portion is moved or in a fixed state in which the shaft-sealing portion is not moved, it is required to have high durability, high insertability and a high pressing crack prevention property, not to mention the securement of a shaft-sealing function. Thus, since the first object of an ordinary shaft-sealing device is to heighten a sealing function with the sealing member, the position of the sealing member or fluid-sealing region is generally prescribed. For this reason, an apparatus having the sealing device built therein has a complicated internal configuration.

Assuming that an operation of switching the sealing region to an unsealing region is performed to move the sealing region and use the shaft-sealing device as various kinds of drive sources, it is necessary to provide a separate motion mechanism at a section to which the sealing member within the sealing region or housing is to be attached. As the motion mechanism, a screw-feeding mechanism, piston-cylinder mechanism, rotation mechanism can be raised and, in order to operate these mechanisms, it is also necessary to use some power means including human power, electricity, air, hydraulic pressure, a spring, etc.

On the other hand, a valve using a polymer actuator has been proposed in order to switch a sealing region to an open or closed state (refer to Patent Document 1, for example). The valve of Patent Document 1 uses an artificial muscle as a valving element and has a polymer actuator capable of switching a flow passage through deformation of the valving element per se without use of any complicated power means. The artificial muscle is made of electrostrictive elastic polymer film and deformed through an on-off operation of voltage to come into contact with or separate from a valve seat directly or via a sealing material, thereby opening or closing the flow passage. The valve of Patent Document 1 has an EPAM (Electroactive Polymer Artificial Muscle) structure in which the thin rubber-like polymer film (elastomer) is sandwiched between elastic electrodes and elongated in a planar direction (enlarged in diameter in a circumferential direction) through the application of voltage between the electrodes. In this artificial muscle, in order to make the amount of distortion or deformation larger, the electrodes are disposed over the entire voltage-applying region surface of the polymer film to increase the amount of electrical load to be injected

PRIOR ART DOCUMENT

Patent Document 1: Japanese Patent No. 3501216

In the case where it is intended to perform opening and closing of the flow passage and control of the flow rate using the shaft-sealing device, however, the motion mechanism or power means for switching the sealing region to the unsealing region is necessitated as described above and, in this case, problems of complicating the device structure, enlarging the size of the entire device and increasing the weight thereof have been entailed. In addition, since mutual contact or sliding motion of parts constituting the motion mechanism is induced when performing switching between the sealed state and the unsealed state, the contact or sliding motion has caused the parts constituting the motion mechanism to be worn away and members mutually slid to be worn away. Furthermore, since the sealing member per se is moved in a state in which it is brought into contact with or pressed against a counterpart slide member within the sealing region, wear resulting from the sliding motion has been induced. When a portion sealed with an O-ring has been worn away over to the entire circumference thereof, a reduction of pressure at the contact portions or fluid leakage due to an injury has been caused with ease and, in this case, wear has possibly accelerated due to external factors including coarse sliding surfaces and insufficient lubrication effects. Moreover, when the slide surface of the O-ring has been worn away locally, fluid leakage is apt to be induced and, when the slide surface of the O-ring has been injured, wear has possibly been further accelerated. In particular, when the motion mechanism is moved at a low kinetic rate or in an eccentric state, when the sliding surfaces are coarse or when the lubrication effects are insufficient, the O-ring may have possibly been twisted. For these reasons, the shaft-sealing structure using the O-ring cannot sufficiently secure the scalability thereof and, since it is not suitable for opening and closing the flow passage or controlling the flow rate, it is difficult to utilize as various kinds of drive sources.

On the other hand, though Patent Document 1 eliminates use of a complicated power mechanism because the valving element per se is used as the polymer actuator made of the EPAM, since the valving element per se is made of the EPAM, fluid pressure is received on the overall pressure-receiving area of the EPAM. Therefore, the EPAM is required to have a large pressure capacity and a large sealing force. In addition, the main body has to be provided therein with a separate sealing mechanism and a valve seat portion for seating. Therefore, the application of the EPAM to the valving element per se is not rational because the pressure capacity of the EPAM and the stress characteristics thereof with deformation are not utilized without modification thereto.

Moreover, since this valve has a structure in which the electrodes are disposed on the entire voltage-applying region surface of the polymer film, the amount of deformation has its own limits on the application of constant energy in the case of using the polymer film for a movable portion of the valving element or actuator for the valving element. For this reason, when a desired flow rate adjustment ability and sealing ability of the valve closed have been taken into consideration, the structure can only be adopted for valves having a relatively small caliber and is impracticable. Thus, also this valve is not suitable for use as various kinds of drive sources.

The present invention has been developed as a result of keen studies on the aforementioned state of affairs and the object thereof is to provide a polymer actuator capable of being utilized as various kinds of drive sources and particularly capable of sufficiently applying its amount of deformation to a valve or shaft-sealing device.

SUMMARY OF THE INVENTION

To attain the above object, the invention is directed to a polymer actuator comprising a power driver deformed upon receiving external electro stimuli and electrodes disposed on upper and lower surface sides of the power driver in an opposite manner for applying positive and negative external electro stimuli to the power driver in a planar fashion, wherein the electrodes have different stimuli application regions to have different electrical field distributions for causing distribution of stress generated in the power driver to be eccentrically located on one of positive and negative sides, thereby bending and deforming the power driver onto a side on which the opposite stimuli application regions do not exist.

The invention also directed to a polymer actuator comprising a power driver deformed upon receiving external electro stimuli and fixed electrodes fixed to upper and lower surface sides of the power driver in an opposite manner for applying positive and negative external electro stimuli to the power driver in a planar fashion, wherein the fixed electrodes have different stimuli application regions to have different electrical field distributions for causing distribution of stress generated in the power driver to be eccentrically located on one of positive and negative sides, thereby bending and deforming the power driver onto a side on which the opposite stimuli application regions do not exist.

The invention can further comprise a flexible deposited electrode vapor-deposited at a relative or irrelative position between the power driver and the fixed electrode of the fixed electrodes that has a wide stimuli application region and deformed integrally with the power driver in a course of the power driver being bent and deformed to apply external electro stimuli to the power driver.

In the invention directed to the above polymer actuator, the electrode of the electrodes can be disposed on the upper and lower surface sides of the power driver, which has a wide stimuli application region, constitutes a flexible deposited electrode that is deformed integrally with the power driver in a course of the power driver being bent and deformed for applying external electro stimuli to the power driver and buried in the power driver.

In the invention directed to the above polymer actuator, the power driver can be formed of an electro stimuli-responsive polymer material that returns to an original position when stopping application of external electro stimuli and, when the external electro stimuli have been applied, causes a section thereof other than a section thereof having received the external electro stimuli to be bent and deformed.

In the invention directed to the above polymer actuator, one of the fixed electrodes can be an inclined surface that separates from the power driver in a spreading manner in a diametrical direction of an outer end of the power driver.

In the invention directed to a valve using the above polymer actuator, body having plural flow passages can be provided, wherein the polymer actuator is disposed within the body as a valving element that opens or closes the flow passages or controls a flow rate.

The invention directed to a shaft-sealing structure using the above polymer actuator, can further include a main body and a shaft-sealing part formed in the main body, wherein the polymer actuator is applied to the shaft-sealing part to allow a fluid-leaking phenomenon to occur through deformation of the polymer actuator.

EFFECTS OF THE INVENTION

According to the invention, it is possible to provide a polymer actuator capable of controlling a flow rate through an increase in amount of deformation of an EPAM, i.e. an electro stimuli-responsive polymer material, at the time of applying stimuli thereto or stopping the application. In this case, since no wear is induced due to the movement of the power driver, it is possible to flow a fluid by switching the open and closed states with the simple internal structure while maintaining high sealing performance. In addition, by adjusting the amount of deformation of the power driver with an external electric signal and adjusting the contact surface pressure to control the flow rate, the polymer actuator can control the amount of the fluid in the range of from a small flow rate to a large flow rate and, therefore, be applied to various applications. Furthermore, since the power driver can be deformed without using any motion mechanism, it is possible to prevent internal deterioration and maintain excellent performance over a long period of time. As a result, the polymer actuator of the present invention can be utilized as any of various drive sources or applied also to a valve for an air actuator or electromagnetic valve and, since it can control a small amount of leakage in a state in which the flow passage has been kept closed, it can be practically applied further to various technical fields.

According to the invention, the effects of preventing the fixed electrodes from being exposed and eliminating a short circuit when having applied voltage to suppress occurrence of malfunction can be attained in addition to the effects in described above.

According to the invention, since it is possible to assist the application of voltage from the fixed electrode, even when the power driver has separated from the fixed electrode, it is possible to maintain the application of the voltage to the power driver. As a result, it is possible to increase the amount of deformation of the power driver.

According to the invention, by sandwiching the power driver between the deposited electrode and the fixed electrode, one of the fixed electrodes can be omitted. As a result, it is possible to simplify the structure and facilitate the manufacture of the polymer actuator.

According to the invention, it is possible to provide a polymer actuator capable of deforming a portion not exposed to external electro stimuli when having applied the external electro stimuli to thereby eliminate the necessity of providing an electrode on the portion and increasing the amount of deformation because the free end is deformed. For this reason, it is possible to increase the flow rate and control the flow rate with high accuracy.

According to the invention, since the forward end section at the outer end of the fixed electrode does not prevent the deformation of the power driver, the power driver can naturally be bent along the inclined surface to greatly increase the deformation of the power driver as compared with use of a flat electrode.

According to the invention, it is possible to provide a valve using the polymer actuator that can be formed, with compactness attained, because it is provided with the drive part having a simple structure and utilized as a switching valve having a structure that has not existed conventionally and can switch plural flow passages. Furthermore, since the number of flow passages can be changed in accordance with embodiments to be carried out and control the open and closed states of each flow passage and the flow rate with high accuracy even when the valve is used in an embodiment of a multi-way valve. For this reason, the valve can be applied to various technical fields.

According to the invention, it is possible to provide a shaft-sealing structure capable of being formed, with compactness attained, and controlling the amount of fluid leakage with high accuracy. Furthermore, since it is possible to control a small amount of leakage in the shaft-sealed state, the shaft-sealing structure can be applied to various technical fields.

BRIEF DESCRIPTION OF THE DRAWINGS

FIG. 1 includes schematic views showing a polymer actuator of the present invention, (a) being a schematic view showing a distribution of electrical fields applied to the polymer actuator, (b) being a schematic view showing a state in which stress is generated in the polymer actuator and (c) being a schematic view showing a state in which the polymer actuator is deformed.

FIG. 14 includes graphs showing measurement conditions of the displacement measurement device and measurement results of the amount of displacement, (a) being a graph showing voltage-applying conditions, (b) being a graph showing a state of an electrical current at the time of the voltage application and (c) being a graph showing the amount of displacement of a body to be measured.

FIG. 15 includes schematic views showing a bent and displaced portion of the body to be measured, (a) being a schematic view showing the displaced portion of the body to be measured and (b) being an enlarged view of a portion A in (a).

FIG. 24 includes schematic views showing states in which vectors of electrical fields applied to the polymer material have been generated, (a) being a schematic view showing a generation state of electrical field vectors in the case where applied regions are equal to each other and (b) being a schematic view showing a generation state of electrical field vectors in the case where applied regions are different from each other.

FIG. 25 includes schematic views showing states in which stress spectra applied to the polymer material are generated, (a) being a schematic view showing a stress spectra-generating state in a case where the applied regions are equal to each other and (b) being a schematic view showing a stress spectra-generating state in a case where the applied regions are different from to each other.

FIG. 26 includes schematic views showing states in which polymer materials have been bent, (a) being a schematic view showing a state in which the sealing body has been bent and (b) being a schematic view showing a state in which a drive body has been bent.

FIG. 27 is a schematic view showing another example of polymer material.

FIG. 30 includes schematic views showing states of deformation of the shaft-sealing body, (a) being a schematic view showing a state of deformation of the shaft sealing body in the case where application regions are equal to each other, (b) being a schematic view showing a state of deformation of the shaft sealing body in the case where application regions are different from each other and (c) being a schematic view showing a state in which the sealing body has been bent.

DETAILED DESCRIPTION OF THE INVENTION

Embodiments of polymer actuators according to the present invention will be described in detail hereinafter with reference to the drawings. FIG. 1 shows one embodiment of the polymer actuator according to the present invention, in which a main body of the polymer actuator (hereinafter referred to as the actuator body) 10 has a power driver 11, electrodes 12 and 13 and a deposited electrode 14.

Figures 2, 3:
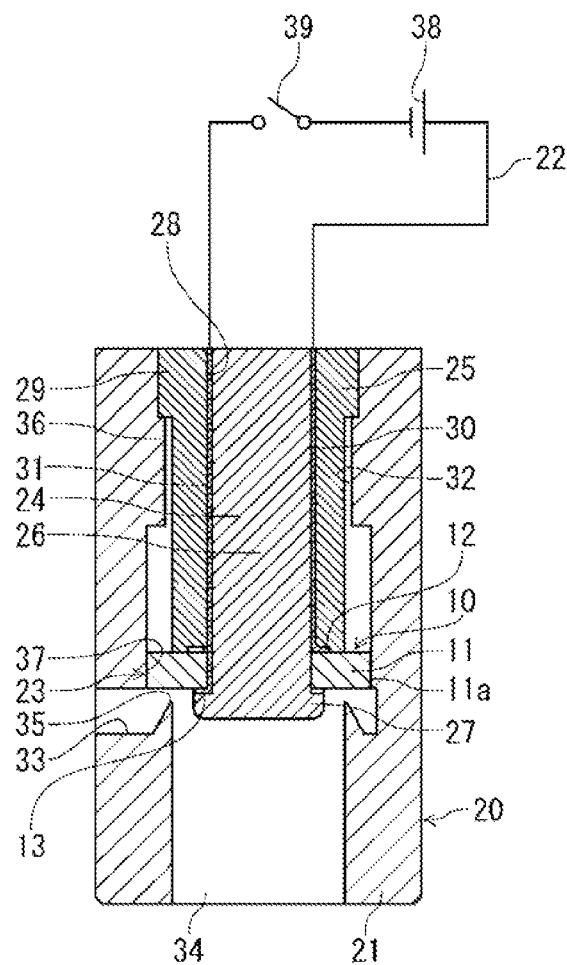
FIG. 2 is an explanatory view showing the characteristics of an electro stimuli-responsive polymer material.
FIG. 3 is a schematic cross section showing an example in which the polymer actuator of the present invention is used for a valve.

The power driver 11 is formed of a material deformable through electrical stimulation and, in the present embodiment, an electro stimuli-responsive polymer material that returns to an original position when stopping application of external electro stimuli and, when the external electro stimuli have been applied, causes a section thereof other than the section thereof having received the external electro stimuli to be bent and deformed. Here, the deformation used in the present invention is defined by a change in shape made irrespective of an increase or decrease in a volume change of the power driver 11. That is to say, the "deformation" in the present invention includes both the case where the power driver 11 increases and decreases in size with a volume change and the case where the power driver changes its shape without any volume change. The characteristics of the electro stimuli-responsive polymer material having a section thereof, other than the section thereof to which the electrical stimuli have been applied, deformed are shown in FIG. 2.

As one example of the electro stimuli-responsive polymer material constituting the power driver 11 in FIG. 1, for example, polyether urethane can be cited. This material comprises a mixture of a base compound and a curing agent. The base compound includes at least styrene, nitrile compounds, BHT (ButylHydroxyToluene), and ester phthalate. On the other hand, the curing agent includes at least phthalic acid, diphenylmethane di-isothianate, and ester phthalate. As a concrete example of the electro stimuli-responsive polymer material containing these components, a gel sheet manufactured by EXSEAL Corporation and sold under the trade name Hitohada (registered trademark) can be raised, for example. In addition, the electro stimuli-responsive polymer material may be formed of thin silicon film, for example, besides the polyether urethane and, in this case, the same functions and characteristics as described above can be fulfilled. Furthermore, other materials than those mentioned above may be used insofar as the materials can fulfill the same functions and characteristics as described above. In the present embodiment, polyurethane elastomer is used as the electro stimuli-responsive material.

On the other hand, the electrodes 12 and 13 are disposed on the upper and lower surface sides of the power driver 11 in an opposite manner so as to sandwich the power driver 11 locally therebetween and electrically connected each from their respective positions to the exterior. With this structure, the electrodes 12 and 13 can apply positive and negative external electro stimuli to the power driver in a planar fashion. The electrodes comprise the electrode 12 having a wide stimuli application region and formed long on the power driver 11 and the electrode 13 having a narrow stimuli application region and formed short on the power driver 11 and thus have the stimuli application regions different from each other. Furthermore, the electrodes 12 and 13 are fixed electrodes fixed respectively to stationary parts 15 and 16 for fixing the respective electrodes thereto.

Since the electrodes 12 and 13 have the different stimuli application regions, they have different electrical field distributions for causing distribution of stress generated in the power driver 11 at the time of the stimuli application to be eccentrically located on one of the positive and negative sides, thereby bending and deforming the power driver 11 onto a side on which the opposite stimuli application regions do not exist, i.e. in a direction of the electrode 13 on which the stimuli application region is short formed. In addition, the electrodes are disposed at positions shielded from the exterior.

The deposited electrode 14 has flexibility and is vapor-deposited on the side of the wide stimuli application region, i.e. on the power driver 11 at a position relative or irrelative to the electrode 12 between the electrode 12 and the power driver 11, and formed integrally with the power driver 11. The deposited electrode 14 is adapted to apply external electro stimuli to the power driver 11 while being deformed together with the power driver 11 in the course of the power driver 11 being bent and deformed.

While in the present embodiment, as shown in FIG. 1 in which the electrodes 12 and 13 are the fixed electrodes, the deposited electrode 14 is vapor-deposited on the side of the fixed electrode 12 having the wide stimuli application region, of the fixed electrodes 12 and 13, it may be adopted that only the deposited electrode 14 is used as an electrode having a wise stimuli application region to eliminate the use of the fixed electrode 12. In this case, though not shown, the deposited electrode 14 is buried in the power driver 11 and therefore shielded from the exterior when a fluid passing through the actuator body 10 is liquid to thereby enable voltage from being short-circuited due to contact of the liquid with the deposited electrode 14. In shielding the deposited electrode 14 within the power driver 11, it is possible to bury the deposited electrode in the fixed electrode by the procedure comprising placing the deposited electrode on a power driver formed in small thickness and folding the deposited electrode back so as to get the power driver thereinto.

Next, with respect to the basic technique and operation of the aforementioned actuator body 10, the shaft-sealing device of the PCT application (PCT/JP2008/61259) that has already been proposed by the present applicant will first be described hereinafter.

This shaft-sealing device is provided therein with a shaft-sealing body 1 and fixed electrode portions 2 and 3. The shaft-sealing body 1 is formed of a polymer material, such as polyurethane elastomer, capable of being swollen upon receiving external electro stimuli. In addition, the fixed electrode portions 2 and 3 are formed to have an equal length and disposed on the upper and lower sides of the shaft-sealing body 1. Furthermore, when an electrical field has been applied to the fixed electrode portions 2 and 3, the shaft-sealing body 1 is deformed and this deformation allows a leaked fluid to flow on a flow passage not shown.

To be specific, when the electrical field has been applied to the fixed electrode portions 2 and 3 in FIG. 30, a stress generated by the electrical field induces, in the shaft-sealing body 1 at relative sections of the fixed electrode portions 2 and 3 or at a portion of the shaft-sealing body 1 projecting from the fixed electrode portion 2, (1) a stress having electrical field vector distribution in consequence of the fact that dielectric polyol or polyol having a dipole moment is oriented by the electric field to thereby change the structure of a polymer chain as shown in. FIG. 30(*a*). At this time, as shown in FIG. 30(*b*), (2) the Coulomb effect by the fixed electrode portions 2 and 3 and the electrical field therearound reduces a thickness-direction width of the shaft-sealing body 1 to thereby swell the shaft-sealing body 1 in a lengthwise planar direction at an angle of 90° relative to the thickness direction. In addition, as shown in FIG. 30(*c*), (3) by means of the injection and eccentric location of the electrical charge an asymmetric volume change is induced on both the electrode portions to generate a stress.

Thus, the three actions (1) to (3) are exerted on the shaft-sealing body 1 to deform the shaft-sealing body 1. On this occasion, a stress generated in the shaft-sealing body 1 is generated by electrical field distribution between the relative fixed electrode portions 2 and 3 to constitute vectors between the fixed electrode portions 2 and 3 and in the shaft-sealing body 1 around the peripheries of the fixed electrode portions, which vectors are directed from a high-potential side to a low-potential side. The vectors have distribution in which the size thereof becomes maximum at the peripheral sections of the fixed electrode portions 2 and 3 to and gradually attenuates toward the peripheral sides in the radial direction (planar direction) that are sections not in contact with the fixed electrode portions 2 and 3. These stresses are exerted in the direction of bending the shaft-sealing body 1 from the high-potential side to the low-potential side and, at this time, the shaft-sealing body 1 is bent, with the peripheral portion of the fixed electrode portion 3 on the low-potential side functioning as a fulcrum of bending and deformation.

Subsequently, the operation of the actuator body 10 of the present invention having the electrodes 12 and 13 will be described with reference to FIG. 1. In this case, the electro stimuli-responsive polymer material (polyurethane elastomer, for example) constituting the power driver 11 is sandwiched between the electrodes 12 and 13 having different lengths and further between the deposited electrode 14 formed on the electrode 12 having the larger length and the electrode 13 having the smaller length. The power driver 11 has a portion sandwiched between the electrodes 12 and 13 and a portion not in contact with the electrodes 12 and 13 and extending outward.

When an electrical field has been applied to both the electrodes 12 and 13, a stress is generated in the power driver 11 for the reasons described below. The value of the stress thus generated is larger than that generated in the shaft-sealing body 1 in the case of FIG. 30 in which the electrode portions 2 and 3 have the stimuli application regions of the same size and, since the length of a moment on the surface on which the stress is exerted is large, the amount of deformation made at this time is further larger than in the aforementioned case.

When the electrical field has been applied to the electrodes 12 and 13, the following stresses are generated in the power driver 11 similar to the case of the shaft-sealing body 1 sandwiched between the fixed electrode portions 2 and 3 having the stimuli application regions of the same length. As shown in FIG. 1(*a*), (4) a stress having electrical field vector distribution is generated as a result of dielectric polyol or polyol that has a dipole moment being oriented by the electrical field, thereby changing the structure of a polymer chain. At this time, as shown in FIG. 1(*b*), (5) the Coulomb effect by the fixed electrodes 12 and 13 and the electrical field therearound reduces a thickness-direction width of the power driver 11 to thereby swell the power driver 11 in a lengthwise planar direction at an angle of 90° relative to the thickness direction. In addition, as shown in FIG. 1(*c*), (6) by means of the injection and eccentric location of the electrical charge an asymmetric volume change is induced on both the electrodes to generate a stress.

While the power driver 11 is deformed by the stresses (4) to (6), electrical field distribution is such that the electrical field value becomes maximum at the peripheral sections of the electrodes 14 and 13 on the side of the electrode 12 of the power driver 11, on the side of the portion of the electrode 13 on the deposited electrode 14 side and around the peripheral portion at which the electrode 13 does not exist and attenuates in the radial direction (planar direction) of the outside of the power driver 11. Furthermore, since the electrical field is concentrically loaded on the power driver 11 from the peripheral section of the deposited electrode 14 and the portion at which the deposited electrode 14 and electrode 13 do not overlap each other toward the direction in which the electrode 13 comes into contact with the peripheral portion, the stress is effectively exerted to deform the power driver 11. In addition, bending stress vectors V functioning in the bending direction are generated in the peripheral section of the electrode 13 and, by means of these stresses, the bending force is increased by the action of a moment length M, with the portion supported on the end side of the electrode 13 as a fulcrum C to enable the power driver 11 to be bent and deformed to a great extent.

The actuator body 10 of the present invention has improved the shaft-sealing body 1 having the stimuli application regions having the to same length, has the electrodes 12 and 13 having the stimuli application regions of the different lengths, eccentrically locates the distribution of the stress generated in the power driver 11 by means of the stimuli application regions and provides the electrical field distribution for bending and deforming the power driver 11 on the side in which no stimuli application region exists, i.e. on the side of the electrode 13. Therefore, it becomes possible to exponentially increase the amount of deformation of the power driver 11 as compared with the shaft-sealing body 1 of FIG. 30. For this reason, the polymer actuator of the present invention can be used in a pipeline having a flow passage suitable for a drive source or valve.

Here, as a suitable example in using the polymer actuator of the present invention, an embodiment of a valve using the polymer actuator, in which the polymer actuator is mounted on the valve, will be described. FIG. 3 shows a state in which a valve main body 20 is configured using the actuator body 10. The valve main body 20 has an actuator body 10, a body 21 and a power circuit 22.

The actuator body 10 has a drive part 23 comprising a power driver 11 and electrodes 12 and 13, a columnar holder 24 and a cylindrical holder 25. The power driver 11 is formed in the shape of a hollow cylinder having an appropriate thickness. The electrodes 12 and 13 have different polarities, are disposed respectively on the upper and lower surface sides of the power driver 11 in an opposite manner, extend from the upper and lower surface sides of the power driver 11 to the exterior of the body as disposed between the columnar holder 24 and the cylindrical holder 25 and are connected respectively to the power circuit 22.

The columnar holder 24 has a columnar part 26 and a flange part 27 larger in diameter than the columnar part 26. On the other hand, the cylindrical holder 25 has an interpolation part 28 slightly larger in diameter than the columnar part 26 of the columnar holder 24, into which the columnar part 26 can be inserted. In addition, the cylindrical holder 25 is provided on the upper side thereof with a diameter-increased fitting stopper part 29. The electrode 12 is disposed on the bottom surface side of the cylindrical holder 25 via a patterning part 30 on the front surface side of the interpolation part 28 of the cylindrical holder 25, whereas the electrode 13 is disposed on the upper surface side of the large-diameter flange part 27 via a patterning part 31 on the upper surface side of the columnar part 26 of the columnar holder 24. Thus, the electrodes 12 and 13 are fixed as fixed electrodes.

In this case, the electrode 12 is formed long in the diametrical direction, whereas the electrode 13 is formed shorter in the diametrical direction than the electrode 12. As a result, the electrodes 12 and 13 have different stimuli application regions. That is to say, the electrode 12 has a wide stimuli application region and the electrode 13 has a narrow stimuli application region.

The actuator body 10 is thus configured integrally by inserting the columnar part 26 into the interpolation part 28, with the power driver 11 disposed between the columnar holder 24 and the cylindrical holder 25 having the electrodes 12 and 13 disposed beforehand thereon, respectively. At this time, the power driver 11 has its bottom surface side sandwiched on the upper surface side of the large-diameter flange part 27 and its upper surface side sandwiched on the bottom surface side of the cylindrical holder 25 and is positioned and fixed between these holders 24 and 25. With this configuration, it is possible to apply an electrical field from the upper and lower surface sides of the power driver 11 in the presence of the electrodes 12 and 13 to the power driver.

The body 21 is formed in a substantially cylindrical shape and provided in the inner peripheral side thereof with an attachment part 32, plural flow passages 33 and 34 and a valve seat 35. The attachment part 32 is formed on the upper side of the body 21 so as to enable the actuator body 10 to be disposed as a valving element and at a position deep slightly from the entrance side thereof with a stopper projection 36 on which the fitting stopper part 29 of the cylindrical holder 25 can be stopped. In addition, the attachment part 32 is provided in position on the lower side thereof with a seating face 37 on which a forward end face 11a of the power driver 11 abuts. The two flow passages 33 and 34 are formed on the lower side of the body 21 below the seating face 37 so as to communicate with the exterior and, in the present embodiment, pored in directions normal to each other. The valve seat 35 is formed annularly between the flow passages 33 and 34 so as to project from the side of the flow passage 34. Incidentally, though not shown, appropriate pipelines, such as joints or pipes are connected to the flow passages 33 and 34, respectively. The actuator body 10 is attached into the attachment part 32 and made integral with the body 21 in a state in which the fitting stopper part 29 has been fitted on the stopper projection 36. As a result of this integration, the drive part 23 is disposed between the flow passages 33 and 34.

The power circuit 22 has a power source 38 and a switch 39 and is connected to the electrodes 12 and 13. The power circuit 22 is adapted to apply an electrical field to the electrodes 12 and 13 by an on-off operation of the switch 39 and apply external electro stimuli to the power driver 11.

Incidentally, the power driver 11 of the valve main body 20 in the present embodiment has characteristic features in which it returns to an original position while being deformed to bring the valve to an open state when having stopped application of external electro stimuli thereto, whereas it is deformed at a section other than the section having receiving the external electro stimuli to bring the valve to a closed state when having applied the external electro stimuli thereto. Though now shown, however, it may otherwise be configured such that it is deformed at a section other than the section having receiving the external electro stimuli to bring the valve to an open state when having applied the external electro stimuli thereto, whereas it returns to an original position while being deformed to bring the valve to a closed state when having stopped application of external electro stimuli thereto. This is applied to the case of the shaft-sealing structure using the polymer actuator to be described later.

Next, the operation of the valve main body 20 will be described. In the state shown in FIG. 3, the switch 39 is in an off state in which no electrical field is applied from the power source 38 to the power driver 11. In this case, the power driver 11 returns to its original position while being deformed and has the forward end face 11a brought into tight contact with the seating face 37 to form a seal. Therefore, the flow passages 33 and 34 are allowed to communicate with each other to form a valve-open state.

Figure 4:
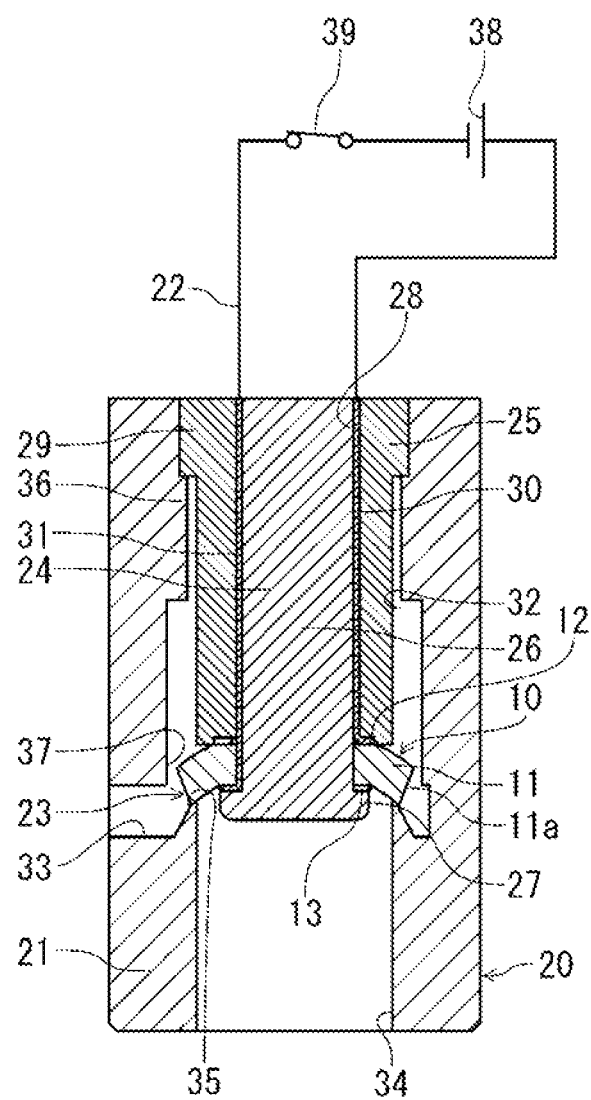
FIG. 4 is a schematic cross section showing a state in which external electro stimuli have been added to the valve of FIG. 3.

When the switch 39 has been switched to an on state, as shown in FIG. 4, electrical fields of different polarities are applied to the upper and lower surface sides of the power driver 11, respectively, from the power circuit 38 via the electrodes 12 and 13. Since the electrode 12 has the wider stimuli application region that the electrode 13, the forward end face 11a of the power driver 11 separates from the seating face 37 and is bent and deformed downward at the time of the application of the electrical fields, thereby abutting on the valve seat 35 to form a seal. For this reason, the power driver 11 cuts off the communication between the flow passages 33 and 34 to form a valve-closed state.

Furthermore, by controlling the amount of the electrical fields applied at this time (the voltage level and time of the voltage application (transient response)), it becomes possible to control the deformation amount and deformation response time of the power driver 11, thereby increasing suppress strength relative to the seating face 37 and, by increasing the voltage gradually from the state of communication between the flow passages 33 and 34, it becomes possible to adjust the amount of deformation of the power driver 11, thereby controlling the flow rate from a large-level flow rate to a small-level flow rate. When the switch 39 has been switched again to an off state from this state, the application of voltage is stopped to allow the power driver 11 to return to the state shown in FIG. 3, thereby forming the valve-open stain again. Thus, the valve main body 20 is adapted to have the actuator body 10 disposed as the valving element and open and close the flow passages 33 and 34 with the valving element or control the flow rate.

Figure 5:
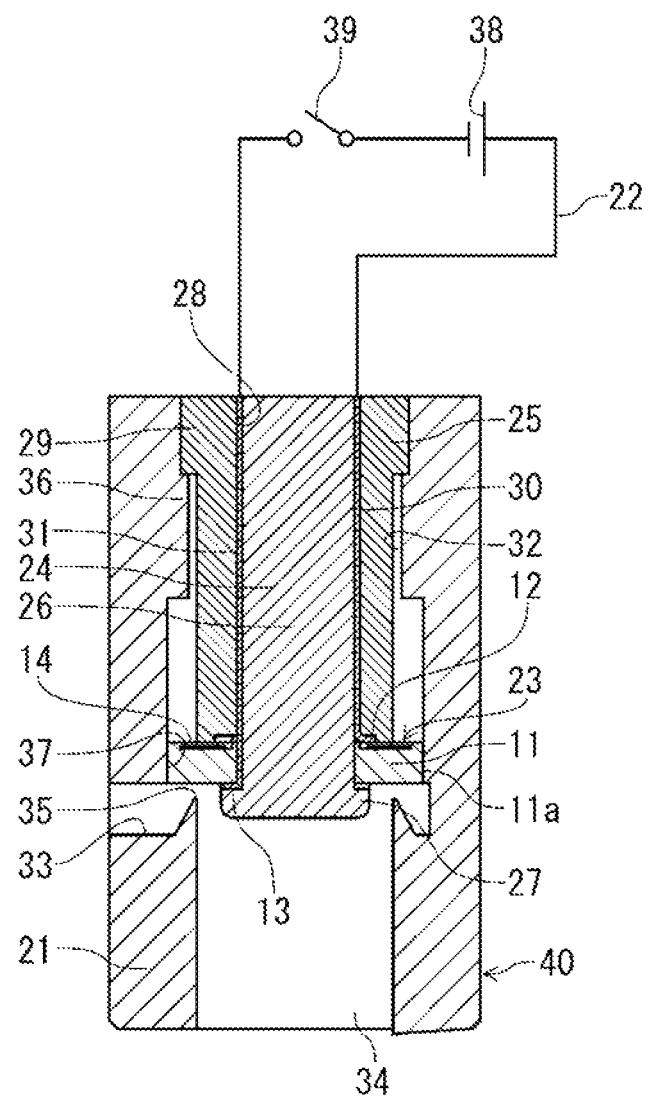
FIG. 5 is a schematic cross section showing an example of a valve in which the polymer actuator of FIG. 3 is provided with a vapor-deposited electrode.

FIG. 5 shows an example in which the valve using the actuator of the present invention is provided with the deposited electrode 14. Incidentally, the elements in the following embodiments that are the same as those in the aforementioned embodiment are given same reference numerals and the description thereof will be omitted. In a valve main body 40, the deposited electrode 14 is disposed as being buried in and shielded by the electrode 12 of the power driver 11 and is electrically connected to the electrode 12. In addition, the deposited electrode 14 is formed long in the radial direction and has a wider stimuli application region than the electrode of the valve main body 20 shown in FIG. 3.

Figure 6:
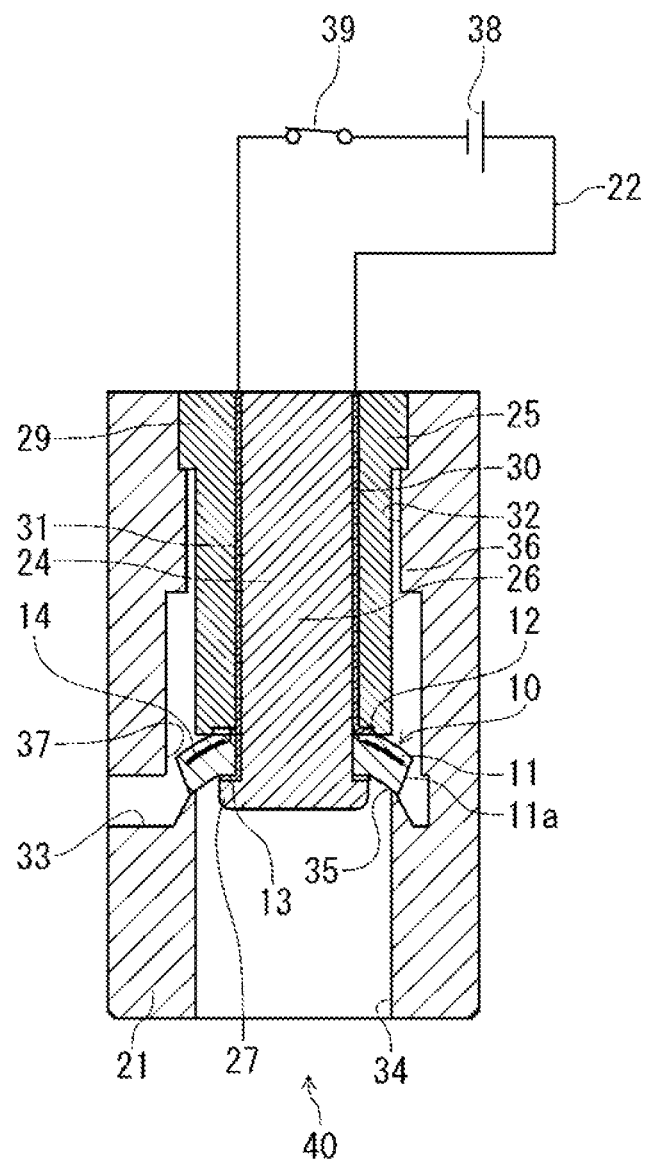
FIG. 6 is a schematic cross section showing a state in which external electro stimuli have been added to the valve of FIG. 5.

In the valve main body 40, as shown in FIG. 6, when the switch 39 has been switched to an on state to apply an electrical field, the voltage thereof is transmitted to the deposited electrode 14 via the electrode 12. At this time, since the deposited electrode 14 has the wider stimuli application region, the power driver 11 can be bent and deformed largely by means of the deposited electrode 14. Furthermore, even when the power driver 11 is intended to separate from the bottom surface side of the cylindrical holder 25, the application of voltage from the deposited electrode 14 to the power driver 11 is maintained. For this reason, the valve main body 40 can bend and deform the power driver 11 more largely and, as a result, it is possible to form a large-caliber valve having the diameter of the flow passages 33 and 34 made large at the time of valve opening.

Figure 7:
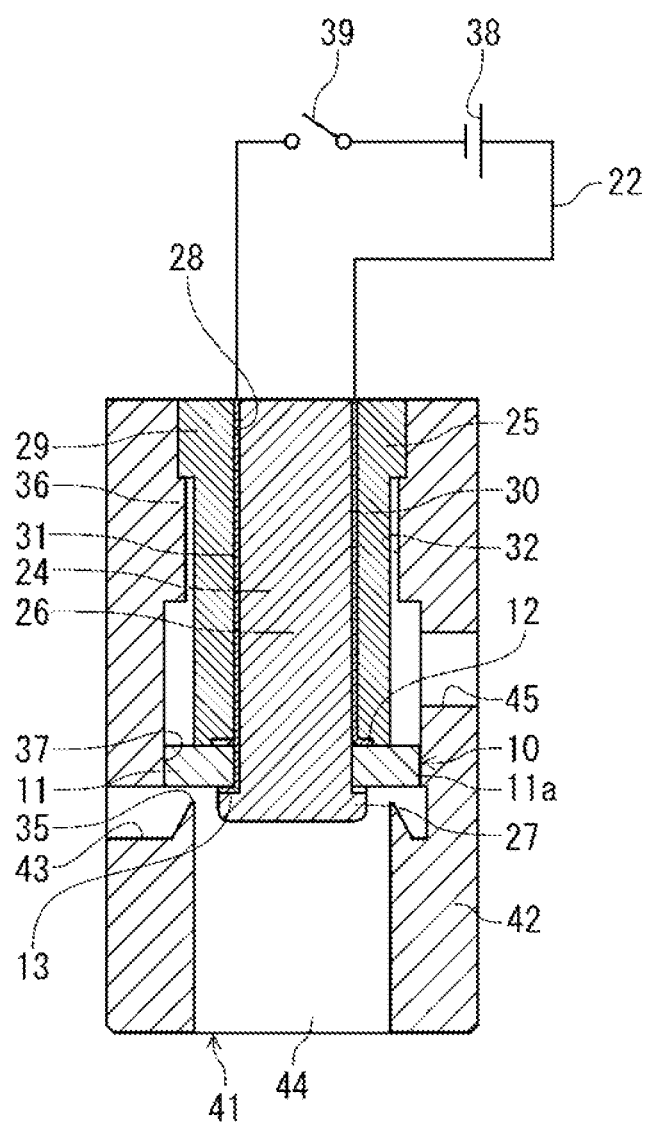
FIG. 7 is a schematic cross section showing an example in which the polymer actuator of the present invention has been used for a three-way switching valve.

FIG. 7 shows an example in which the actuator body 10 constitutes a three-way switching valve 41. In the three-way switching valve 41 in the figure, a body 42 is provided with three flow passages 43, 44 and 45. Of the three flow passages 43, 44 and 45, the two flow passages 43 and 44 are formed on the lower side of the body 42 below the lower side of the seating face 37 so as to communicate with the exterior in the directions normal to each other, and the flow passage 45 is formed so as to communicate with the exterior from the attachment part 32.

In the valve main body shown in FIG. 7, the switch 39 is in an off state, the flow passages 43 and 44 are allowed to communicate with each other when the power driver 11 is brought into tight contact with the seating face 37 to form a seal, and the flow passage 45 is stopped up with the power driver 11. Thus, a fluid flows between the flow passages 43 and 44.

Figure 8:
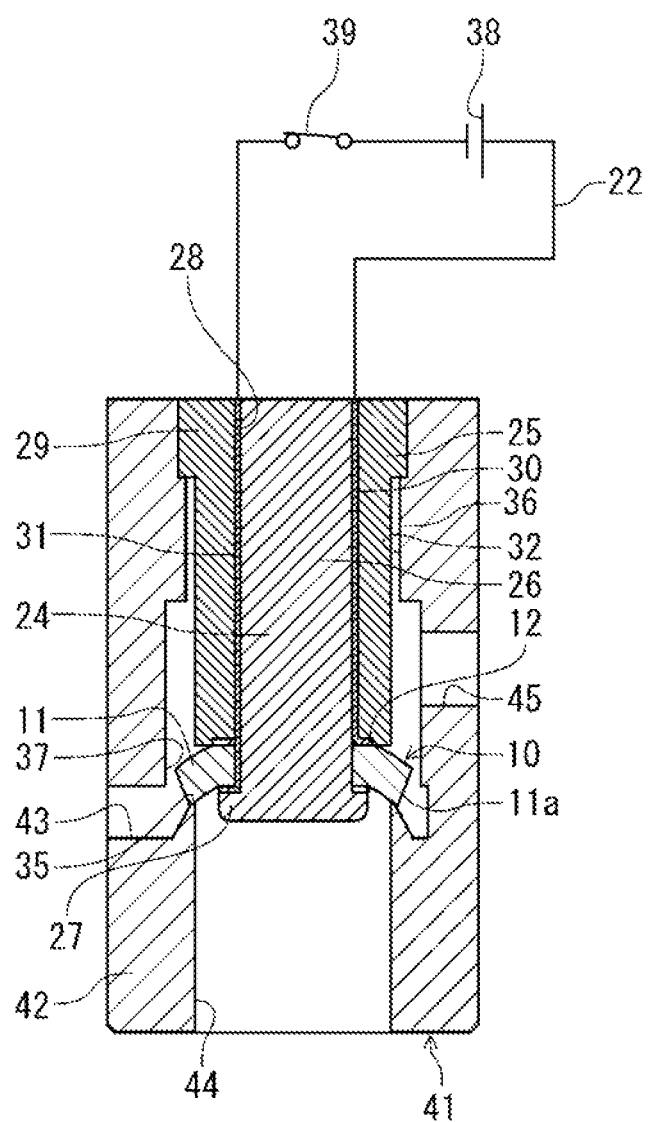
FIG. 8 is a schematic cross section showing a state in which external electro stimuli have been added to the three-way switching valve of FIG. 7.

On the other hand, when the switch 39 has been switched to an on state shown in FIG. 8, the power driver 11 is bent and deformed to separate from the seating face 37, thereby bringing the power driver into abutment on the valve seat 35 to form a seal. For this reason, the flow passage 44 is brought to a stopped-up state, and the flow passages 43 and 45 are allowed to communicate with each other. Therefore, the fluid flows between the flow passages 43 and 45. Thus, the three-way switching valve 41 has a structure in which the three flow passages 43, 44 and 45 are switched through switching the state between the application of the electrical field and the stopping of the application.

Figure 9:
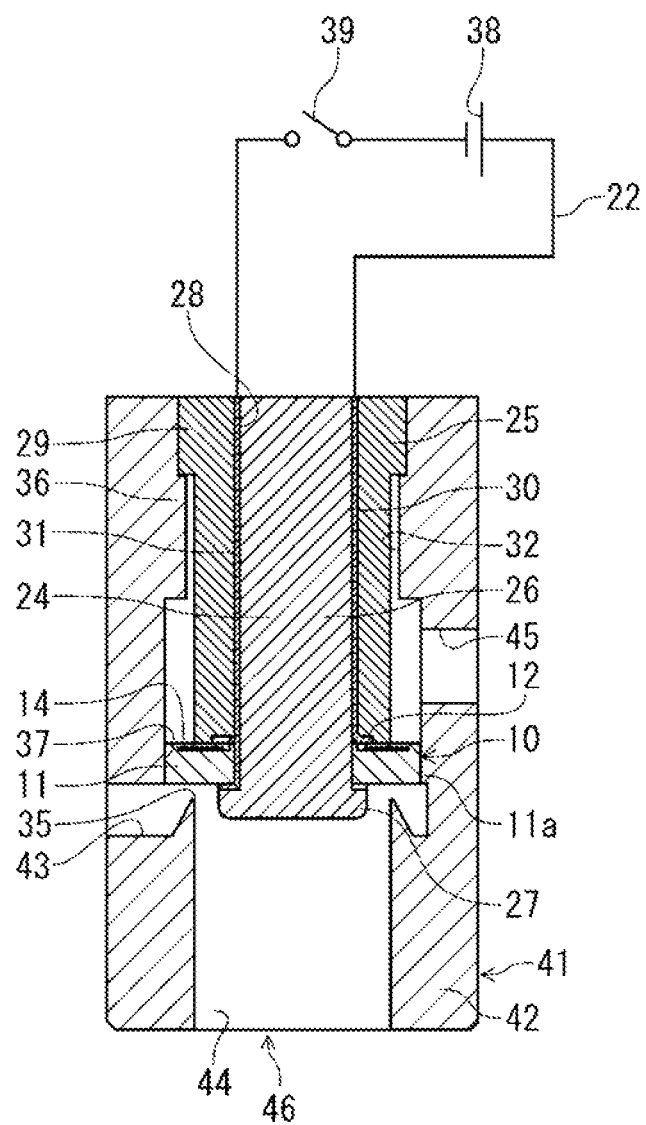
FIG. 9 is a schematic cross section showing an example of a three-way switching valve in which the polymer actuator of FIG. 7 is provided with a vapor-deposited electrode.
Figure 10:
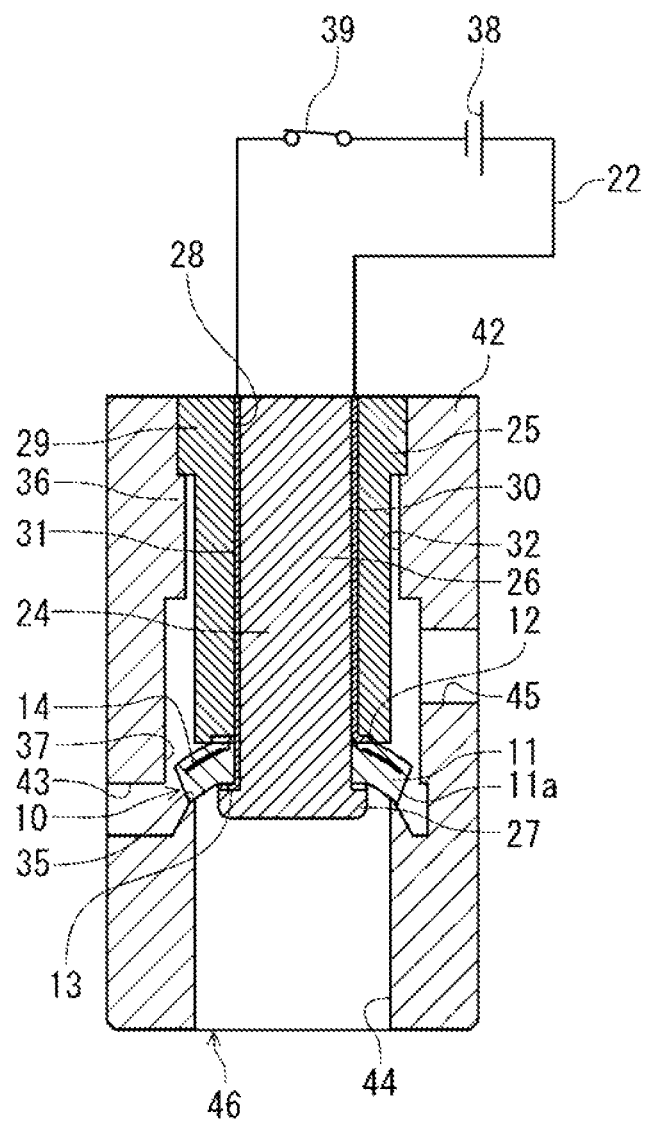
FIG. 10 is a schematic cross section showing a state in which external electro stimuli have been added to the three-way switching valve of FIG. 9.

FIGS. 9 and 10 show an example in which the three-way switching valve shown in FIG. 7 is provided with the deposited electrode 14. The three-way switching valve 46 in this example can bend and deform the power driver 11 largely utilizing the wide stimuli application region of the deposited electrode 14 similarly to the valve main body 40 shown in FIG. 5. For this reason, in FIG. 10, it is possible to secure a large flow passage at the time of bending and deformation of the power driver 11 and provide a large-caliber three-way switching valve 46.

Figure 11:
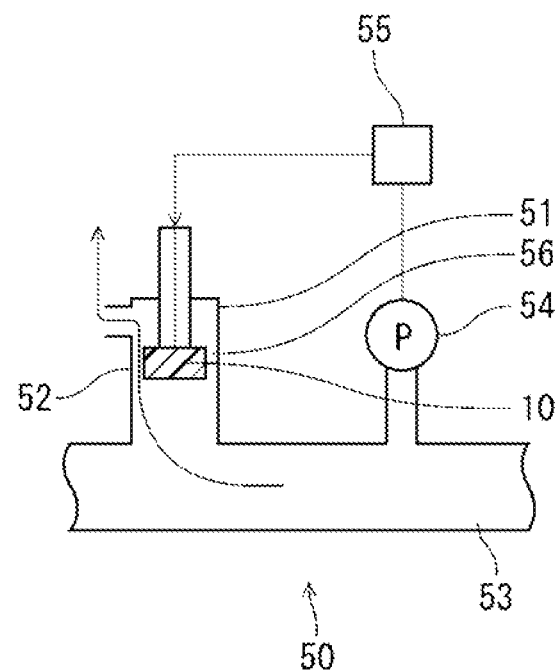
FIG. 11 is a schematic view showing an example in which the polymer actuator of the present invention is utilized for a safety valve.

Next, an example in which the polymer actuator of the present invention is applied to a safety valve will be described. A safety valve 50 shown in FIG. 11 has the polymer actuator of the present invention mounted thereon. The safety valve 50 is provided with an actuator body 51, a housing 52, a pipe 53, a pressure sensor 54 and a switch circuit 55.

The actuator body 61 is disposed inside the housing 52 and formed in an appropriate shape capable of being deformed in a circumferential direction through application of an electrical field or stopping of the application of the electrical field. The actuator body 51 has the same structure as the aforementioned actuator body 10, for example, and is provided therein with the drive part 23 comprising the power driver 11 and electrodes 12 and 13. The housing 52 is attached in a state in which an inside flow passage 56 communicates with the pipe 53, and the pressure sensor 54 is attached to the inside of the pipe 53. The pressure sensor 54 transmits a fluctuation of internal pressure of the pipe 53 as voltage to detect a change of pressure within the pipe 53. The switch circuit 55 is disposed between the pressure sensor 54 and the actuator body 51 and adapted to stop the application of the electrical field to the actuator body 51 in response to the fluctuation of the pressure detected with the pressure sensor 54. In addition, reference voltage to seal the actuator is provisionally applied to the switch circuit 55 until the actuator body 51 reaches a prescribed pressure value at the time of pressure sealing.

In the safety valve 50, when the value of the pressure in the pipe 53 detected with the pressure sensor 54 has reached the prescribed value or more, the switch circuit 55 stops the application of voltage. Subsequently, as a consequence of stopping the application of voltage, the actuator body 51 is deformed in a diameter-reducing direction from the ordinary state and allows the forward end side of the power driver not shown to separate from the inner circumferential surface of the housing 52 to form a gap not shown between the actuator body 51 and the housing 52. The flow passage 56 communicates with the pipe via the gap in consequence of performing a pressure relief to reduce the pressure within the pipe 53. Furthermore, when the pressure has returned to the specified value or less after the pressure relief, the switch circuit 55 applies the voltage of the pressure sensor 54 at that time to the actuator body 51. As a result, the actuator body 51 is deformed in a swelling direction and brings the forward end side of the power driver into intimate contact with the inner circumferential surface of the housing 52 to bring the flow passage 56 to a closed state, thereby sealing pressure leakage.

Figure 12:
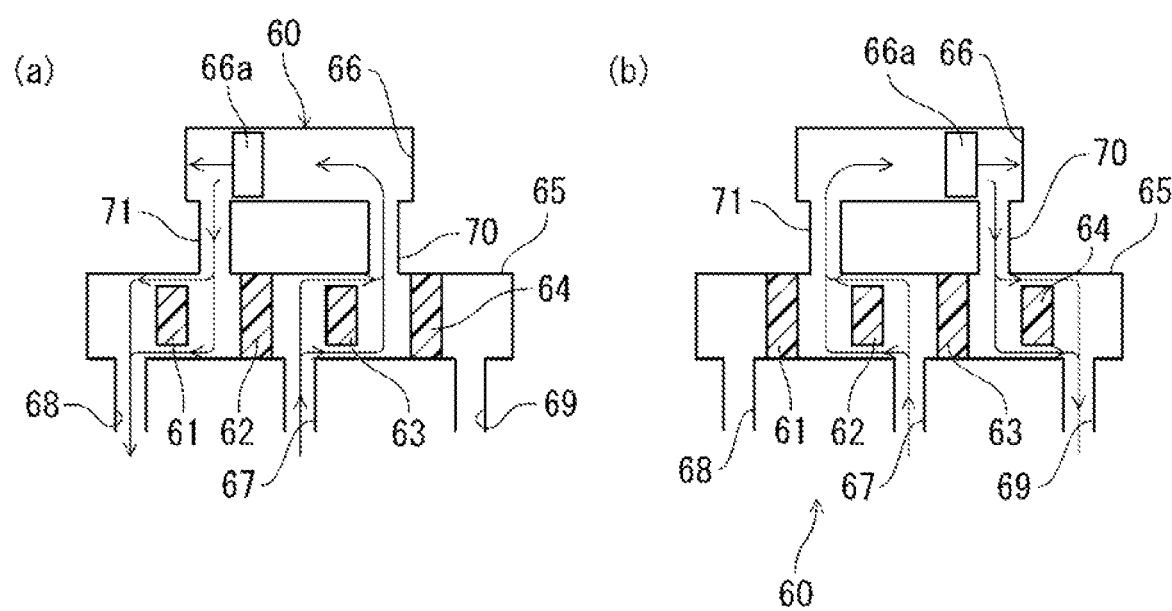
FIG. 12 is a schematic view showing an example in which the polymer actuator of the present invention is utilized for a piston-cylinder mechanism.

On the other hand, FIG. 12 shows a case in which the polymer actuator of the present invention is utilized in a piston-cylinder drive mechanism (hereinafter referred to as the drive mechanism). The drive mechanism 60 is provided with four actuator bodies 61, 62, 63 and 64, a housing 65 and a cylinder part 66.

In the figure, each of the actuator bodies 61, 62, 63 and 64 in the figure has the same structure as the actuator body 10, is housed in the housing 65 and can be deformed in the circumferential direction. The housing 65 is formed therein with flow passages 67, 68, 69, 70 and 71. The flow passage 67 is disposed so as to enable compressed air to be supplied from the exterior into the drive mechanism 60, and the flow passages 68 and 69 are disposed so as to enable the compressed air within the drive mechanism 60 to be discharged to the exterior. In addition, the flow passages 70 and 71 are connected to the cylinder part 66 to and from which the compressed air from the drive mechanism 60 is supplied and discharged.

The actuator bodies 61, 62, 63 and 64 are disposed between the flow passages 68 and 71, between the flow passages 71 and 67, between the flow passages 67 and 70 and between the flow passages 70 and 69, respectively. When voltage has been applied to the actuator bodies 61, 62, 63 and 64, the actuator bodies are swollen or reduced in diameter and deformed to enable shaft sealing between each pair of the flow passages.

In FIG. 12(a), when a control has been made for stopping the application of voltage to the actuator bodies 61 and 63, thereby deforming these in the diameter-reducing direction and for applying voltage to the actuator bodies 62 and 64, thereby deforming these in the diameter-increasing direction, the flow passages 67 and 70 and the flow passages 71 and 68 are respectively allowed to communicate with each other and, at the same time, the flow passages 69 and 70 and the flow passages 71 and 67 are respectively allowed to cut off the communication therebetween.

When compressed air has been supplied from the flow passage 67, with these states maintained, it is sent into the cylinder part 66 via the flow passage 70 to move a piston 66a disposed in the cylinder part 66 leftward. With the movement of the piston 66a, the compressed air within the cylinder part 66 is discharged from the flow passage 68 via the flow passage 71.

On the other hand, in FIG. 12(b), when a control has been made to apply voltage to the actuator bodies 61 and 63, thereby deforming these in a diameter-increasing direction and to apply voltage to the actuator bodies 62 and 64, thereby deforming these in a diameter-reducing direction, the flow passages 67 and 71 and the flow passages 70 and 69 are respectively allowed to communicate with each other and, at the same time, the flow passages 71 and 68 and the flow passages 67 and 70 are respectively allowed to cut off the communication therebetween.

When compressed air has been supplied from the flow passage 67, with these states maintained, it is sent into the cylinder part 66 via the flow passage 71 to move the piston 66a rightward in the drawing. With the movement of the piston, the compressed air within the cylinder part 66 is discharged from the flow passage 69 via the flow passage 70. Thus, in the drive mechanism 60, controlling the application of the application of voltage to the actuator bodies 61, 62, 63 and 64 enables the flow passages to be switched and supplying compressed air from the flow passage 67 enables the piston 66a to reciprocate.

Though the cases of providing the various kinds of actuator bodies, safety valve 50 and drive mechanism 60 using the polymer actuator of the present invention have been described above as absolutely mere examples, the polymer actuator of the present invention can be modified in design without departing from its own configuration and practically applied to various kinds of apparatus and mechanisms.

When the polymer actuator is made of a material resistant to a drug solution and provided as an internal structure, for example, it is possible to provide an apparatus capable of sealing the drug solution or supplying the drug solution while controlling the state of the flow rate of the drug solution. Thus, the polymer actuator can suitably be used as part of liquid-crystal manufacturing devices or semiconductor precision plants, for example. In this case, by freely selecting the material of a pipe connected to the inlet and outlet sides of the apparatus, it is possible to change a fluid to an appropriate fluid.

In the above case, even in any of the embodiments of the valves, since the amount of deformation of the actuator body can be made large, it is possible to control a large flow rate. In addition, since portions of the actuator body having no electrode can be bent structurally without exposing the electrodes to a fluid, the characteristic feature is that the actuator valve can be used safely without inducing leakage of the electrical charge to the outside.

Furthermore, it is possible to form a shaft-sealing structure using the polymer actuator of the present invention. In this case, though not shown, it may be adopted that a body main body having a flow passage inside is provided therein with a shaft-sealing part and the actuator body 10 is applied to the shaft-sealing part to allow a fluid leakage phenomenon to occur with the deformation of the actuator body 10. With this configuration, it is possible to shaft-seal the flow passage to seal the fluid or control the leakage flow rate from the shaft-sealed state to a small level of leakage flow rate. Furthermore, it is possible to generate leakage with the shaft-scaled state maintained, so-called to control a small amount of leakage.

Figure 31:
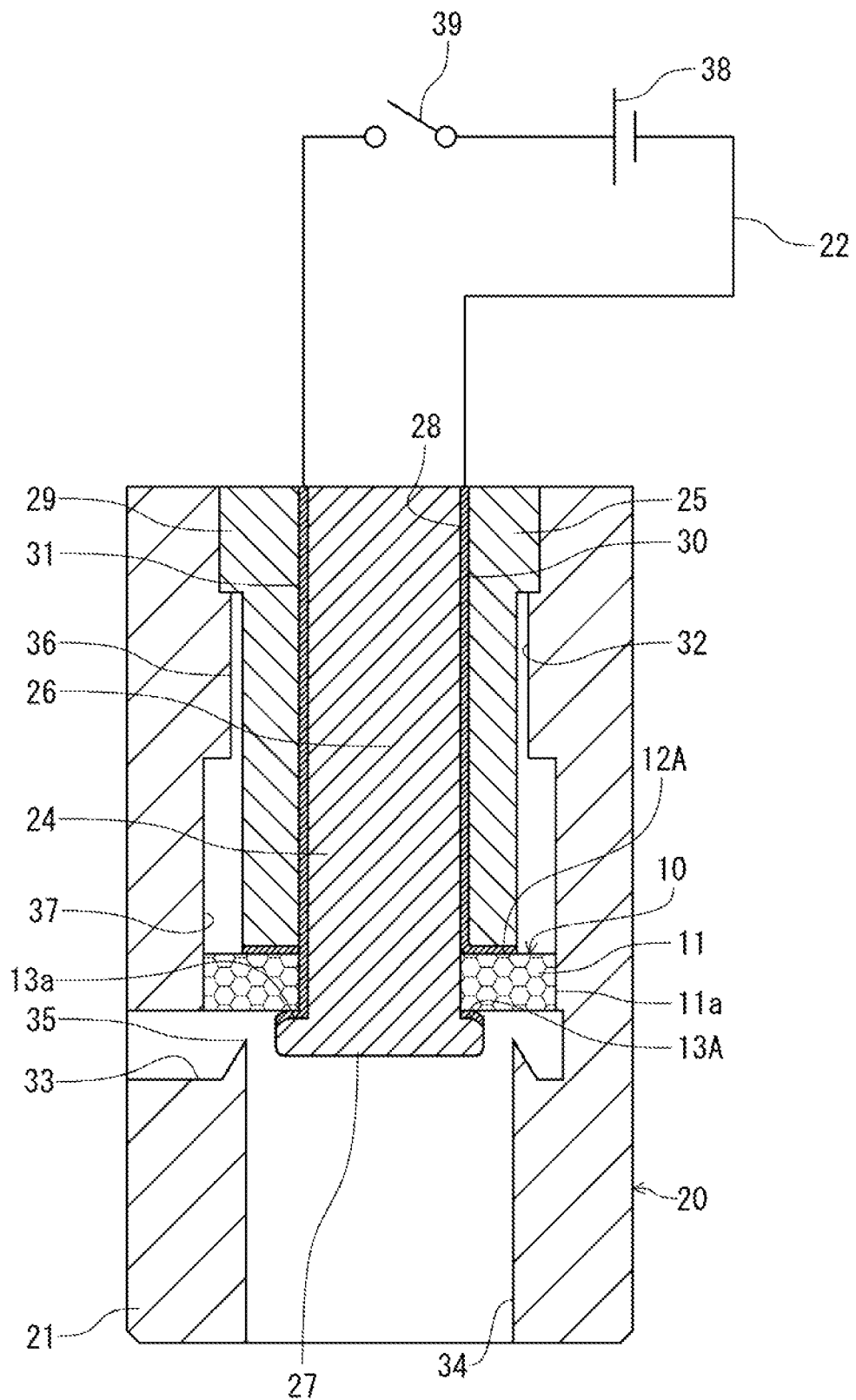
FIG. 31 is a schematic view showing another open example in which the polymer actuator of the present invention has been used for a valve.
Figure 32:
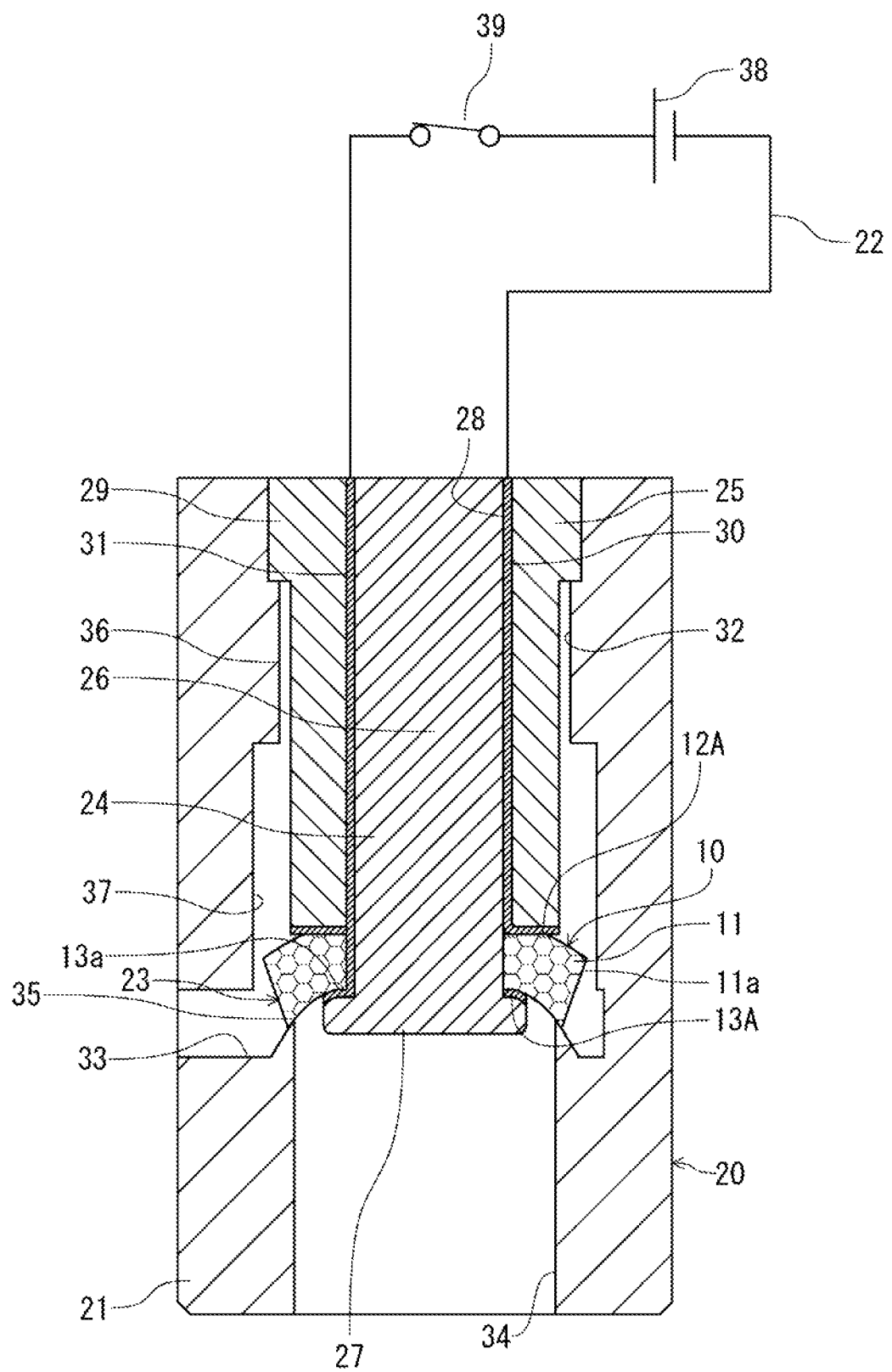
FIG. 32 is a schematic cross section showing a closed state of the valve of FIG. 31.

In FIGS. 31 and 32, the same components as in the example in FIGS. 3 and 4 that are the schematic cross sections are give the same reference numerals and the description thereof is omitted. FIG. 31 shows another example in which the polymer actuator of the present invention is used for a valve and is a schematic cross section showing a valve-open state, and FIG. 32 is a schematic cross section showing a valve-closed state. In FIGS. 31 and 32, of fixed electrodes 12A and 13A, the fixed electrode 13A is provided with an inclined surface 13a that separates from the power driver 11 in a spreading manner in a diametrical direction of the outer end of the power driver 11.

Therefore, by disposing the opposite fixed electrodes 12A and 13A having different lengths and providing one of the electrodes, i.e. the electrode 13A, with the inclined surface 13a, the power driver 11 can be bent naturally along the inclined surface 13a without preventing the deformation of the power driver 11 by means of the forward end section of the electrode 13A to obtain larger displacement than the case of flat electrodes. In addition, since by the application of voltage, the power driver 11 is deformed toward the side of the electrode 13A having the inclined surface 13a, the valve is infallibly brought to a closed state as shown in FIG. 32. Thereafter, by stopping the application of the voltage, the power driver 11 returns to the original position while being deformed, thereby bringing the valve to the open state as shown in FIG. 31.

EXAMPLE 1

Figure 13:
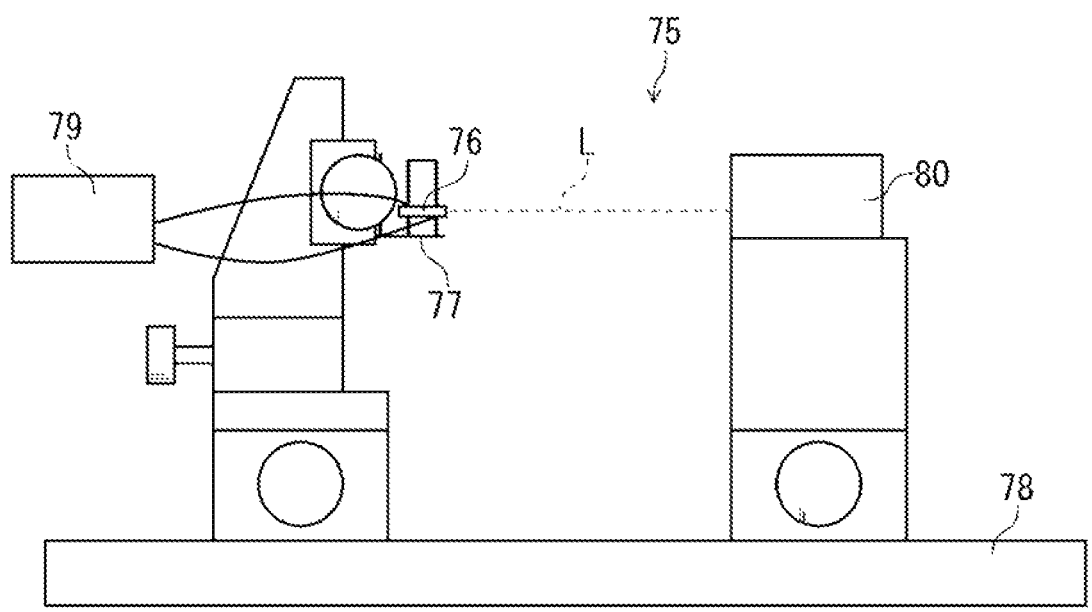
FIG. 13 is a schematic view showing a displacement measurement device.

Examples of the polymer actuators according to the present invention will be described hereinafter. In the present example, in order to confirm whether a deformation mode, in which a portion of an electro stimuli-responsive polymer material other than the portion thereof to which external electro stimuli were applied was deformed, could be utilized for a polymer actuator, prescribed voltage was applied and the amount of the displacement was measured. This measurement was made with a displacement measurement device 75 shown in FIG. 13.

The displacement measurement device 75 has a stand 77 for fixing thereto a target measurement body 76 (a gel sheet of Hitohada (registered trademark) sold under product No. H0-1), which is the electro stimuli-responsive polymer material, and a movement stage 78 capable of moving the stand 77. In addition, it also has a high-voltage power supply 79 (model HJPQ-30P1 produced by Matsusada Precision Inc.), which was connected to unshown fixed electrodes for sandwiching the target measurement body 76 therebetween so that an electrical field may be applied to the target measurement body 76. Furthermore, it further has a laser displacement gauge 80 (model LJ-G080 produced by Keyence Corporation), which irradiates a laser beam L onto the target measurement body 76 and can measure the amount of bending and displacement of the target measurement body 76.

In the measurement with the displacement measurement device 75, first the target measurement body 76 is sandwiched between the unshown fixed electrodes of the displacement measurement device 75 before measurement to fix the target measurement body to the stand 77. In addition, the movement stage 78 is used to adjust the distance between the target measurement body 76 and the laser displacement gauge 80.

With the above state maintained, the high-voltage power supply 79 was operated to increase the voltage applied to the target measurement body 76 from 0 V to 7 kV stepwise by 1 kV every 20 seconds as shown in FIG. 14(a), thereby measuring the amount of deformation of the target measurement body 76 with the laser displacement gauge 80 each time. FIG. 14(b) shows the state of an electric current at the time of the voltage application.

FIG. 15 shows the movement of the target measurement body 76 when the voltage has been applied. As shown in FIG. 15(a), the target measurement body 76 was bent and deformed from its root toward the negative pole side in consequence of the voltage application. In FIG. 15(b), the distance from an end face 76a of the target measurement body 76 when no voltage was applied (application of 0 V) thereto to a corner 76b thereof when voltage was applied thereto was expressed as an amount of bending and deformation δ. The transition of the amount of deformation δ is shown by a graph in FIG. 14(c).

It was confirmed from FIG. 14 that the target measurement body 76 was displaced when the voltage applied was 4 kV or more. Furthermore, when the applied voltage reached 7 kV, the amount of displacement δ was 1.15 mm and, at that time, the amount of displacement was the maximum. In addition, it was confirmed that the target measurement body 76 returned to its initial shape (before the voltage application) when the applied voltage was decreased from the state in which the voltage of 7 kV was applied to the state in which no voltage was applied (application of 0 V).

Since it is confirmed from the above measurement results that the maximum amount of deformation of the target measurement body 76 formed of the electro stimuli-responsive polymer material is 1.15 mm that is a large value under the above conditions, it can be judged that the material is suitably be used as the polymer material used for the polymer actuator of the present invention. The target measurement body 76 was bent toward the negative electrode side in the above case at the time of the voltage application. However, it was confirmed that when the polarity was reversed the bending direction was reversed (bent toward the positive electrode side). Thus, the bending direction is appropriately changed depending on the conditions of the actual use. In addition, in the above case, since the target measurement body 76 is bent and deformed by the application of voltage by the amount of displacement δ constituting the gap, the electro stimuli-responsive polymer material is utilized to enable the configuration of a so-called NC (normally closed) sealing device in a normally closed state. Furthermore, by forming the electro stimuli-responsive material in a bent shape in an initial state and enabling it to be deformed in a plane shape when voltage has been applied thereto, it is possible to configure a so-called NO (normally open) sealing device in a normally open state.

EXAMPLE 2

The distribution of the electric field vectors when voltage was applied to the polymer actuator of the present invention was analyzed by simulation. The simulation was performed with respect to the electro stimuli-responsive polymer material (power driver) 11 of the present invention sandwiched between the electrodes having different stimuli application regions and, for comparison, also to the polymer material (shaft-sealing body) 1 sandwiched between the fixed electrodes having the stimuli application regions of the same size in the shaft-sealing part structure shown in FIG. 30, respectively. The simulation was performed through the analysis of the distribution of the electric field vectors generated inside each of the electro stimuli-responsive materials when the electrical field was applied to the electrodes.

The conditions adopted here for the polymer material 1 sandwiched between the electrode portions 2 and 3 having the stimuli application regions of the same size were that each of the electrode portions 2 and 3 was 5 mm in outside diameter and 1 mm in thickness, that the polymer material 1 was 10 mm in outside diameter and 2 mm in thickness and that the voltages of +1 V and −1 V were applied to the electrode portions 2 and 3, respectively. The relative permittivity of the polymer material 1 at the time of the voltage application was set as ∈=3.

On the other hand, the conditions used for the electrodes 12 and 13 having the different stimuli application regions were that the electrode 12 having the wide stimuli application region was 5 mm in outside diameter and 1 mm in thickness, that the electrode 13 having the narrow stimuli application region was 3 mm in outside diameter and 1 mm in thickness, that the electro stimuli-responsive polymer material was 10 mm in outside diameter and 2 mm in thickness and that the voltages of +1 V and −1 V were applied to the electrode portions 12 and 13, respectively. The relative permittivity of the electro stimuli-responsive polymer material 11 at the time of the voltage application was set as ∈=3.

Figure 20:
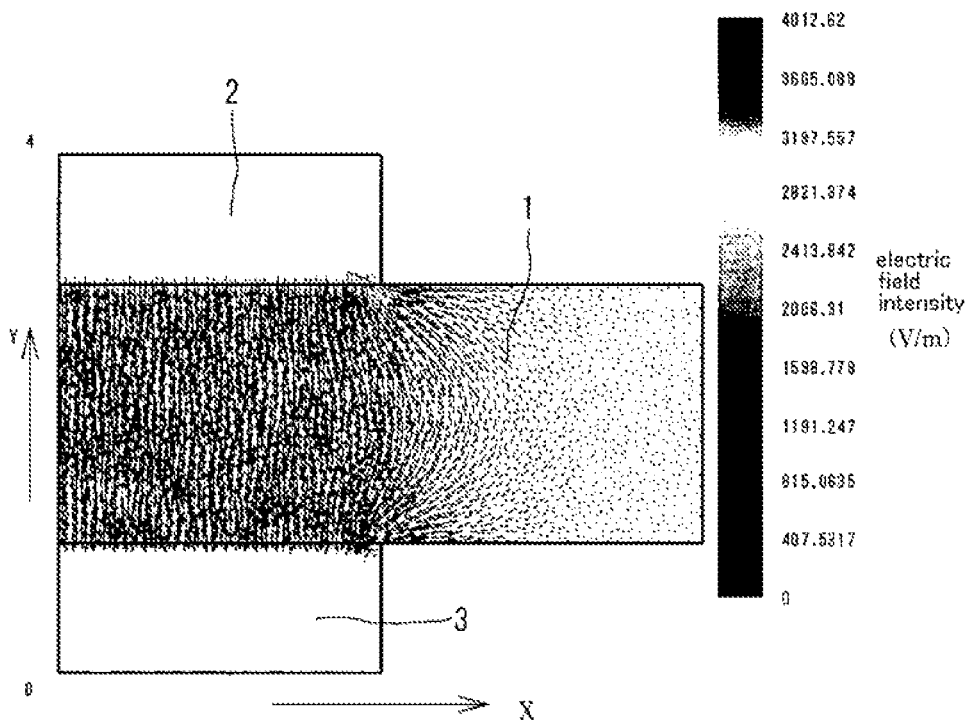
FIG. 20 is a schematic view showing a vector distribution of electrical fields applied to a shaft-sealing body.
Figure 21:
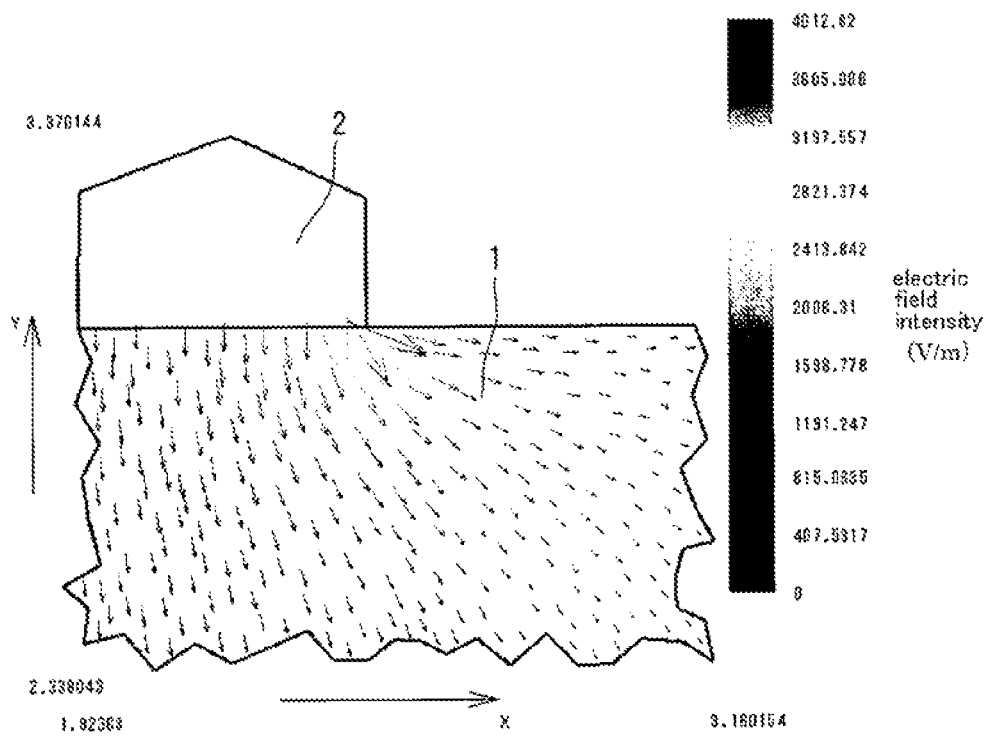
FIG. 21 is an enlarged schematic view showing principal parts of FIG. 20.

As a result of the simulation, in the distribution of the electric field vectors of the polymer material 1 having the electrode portions 2 and 3 of the same size shown in FIG. 20, the maximum electrical field intensity was 4012 V/m and, as shown in FIG. 21, the places where the maximum electric field vectors were generated at that time were the outer circumferential sections of the opposite electrode portions 2 and 3. In addition, as shown in the diagram of the generated electric field vectors in FIG. 24(a), the vector distribution in the direction of bending the portion of the polymer material 1 not in contact with the electrodes 2 and 3 from the region of the polymer material sandwiched between the electrodes 2 and 3 was confirmed.

Figure 22:
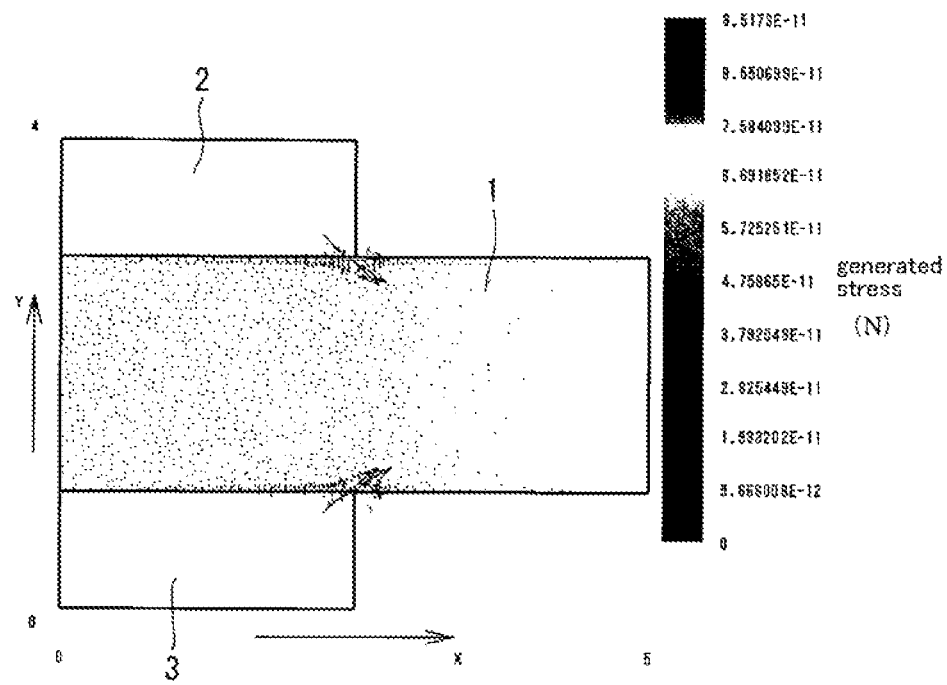
FIG. 22 is a schematic view showing a stress vector distribution in FIG. 20.
Figure 23:
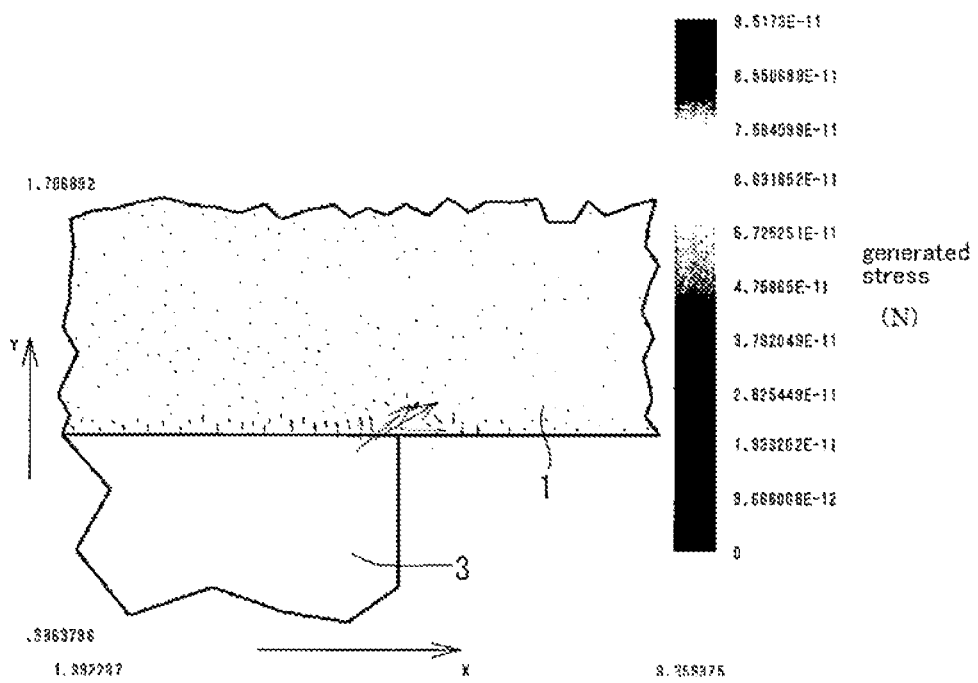
FIG. 23 is an enlarged schematic view showing principal parts of FIG. 22.

In addition, the Maxwell stress was measured from the electric field vector distribution shown in FIGS. 20 and 21 and in the schematic views of stress vector distribution in FIGS. 22 and 23, the maximum stress was $9.5 \times 10^{-11}$ N and the places where the maximum stress was generated were the outer circumferential sections of the opposite electrode portions 2 and 3. With the portion of the polymer material not in contact with the electrode portions 2 and 3 as the place where the maximum stress was generated, as shown in the diagram of vectors of the generated stress in FIG. 25(a), it was confirmed that the distribution of the generated stress existed in the direction of bending the polymer material 1 to the low-potential side, with the outer peripheral portion of the electrode 3 on the low-potential side as the fulcrum.

Figure 16:
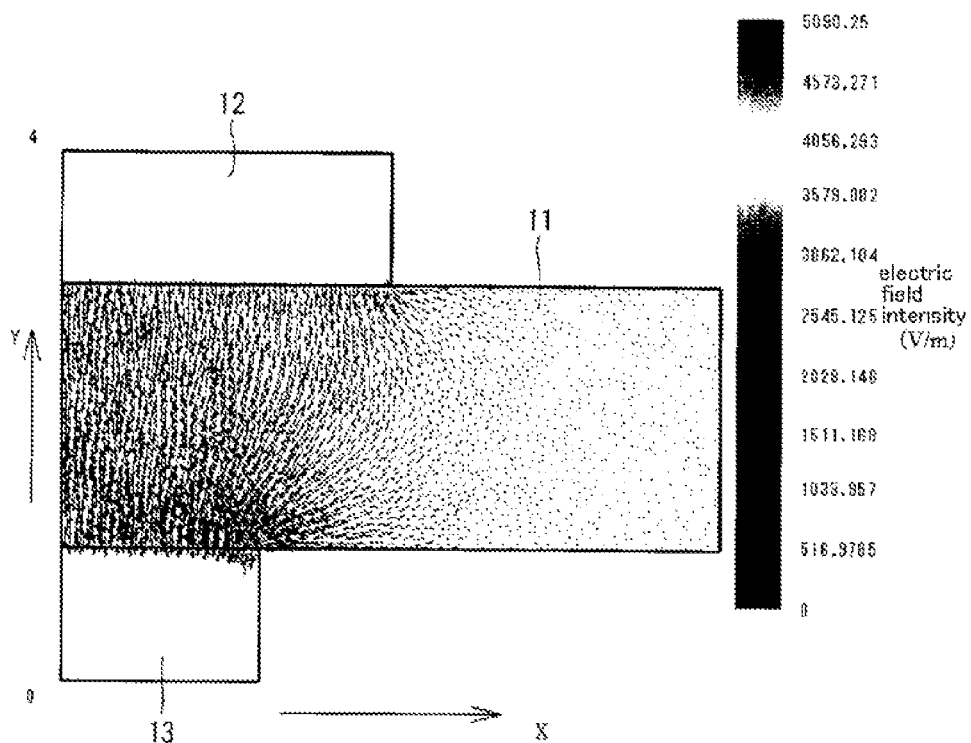
FIG. 16 is a schematic view showing a vector distribution of electrical fields applied to the polymer actuator.
Figure 17:
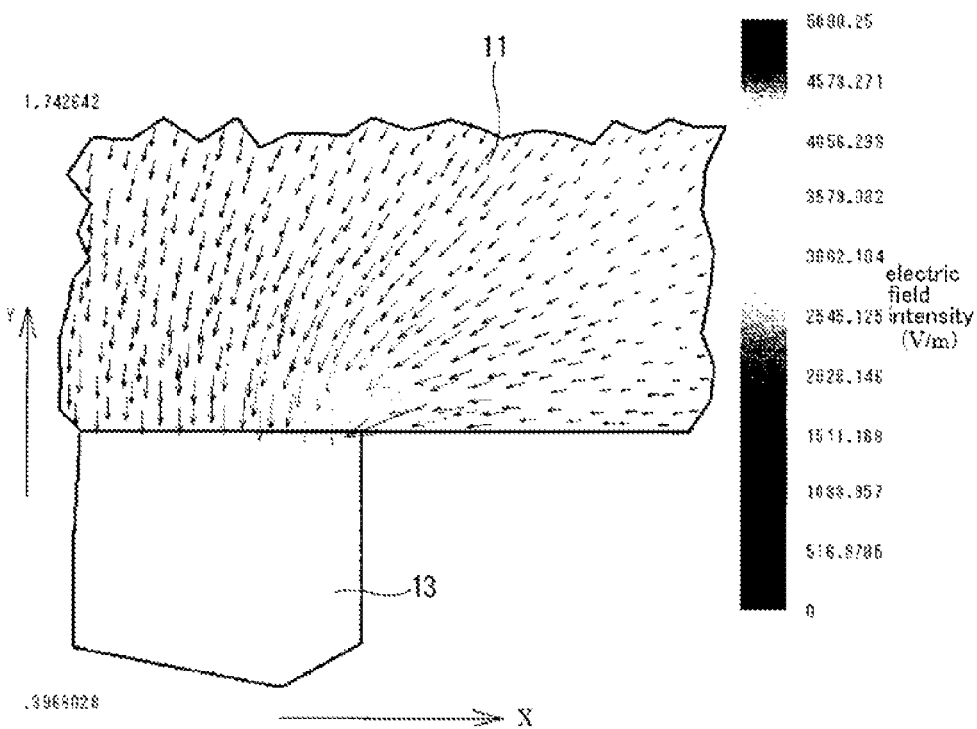
FIG. 17 is an enlarged schematic view showing principal parts of FIG. 16.

On the other hand, the electric field vector distribution of the electro stimuli-responsive polymer material 11 that constituted the electrodes 12 and 13 having the different stimuli application regions was shown in FIG. 16, in which the maximum electrical field intensity was 5090 V/m and the place where the maximum electric field vector was generated at that time was the outer circumferential section of the electrode 13 as shown in FIG. 17. In addition, as shown in the diagram of the generated electric field vectors in FIG. 24(b), the distribution of the vectors in the direction of bending the portion of the electro stimuli-responsive polymer material 11 not in contact with the electrodes 12 and 13 from the portion of the material sandwiched between the electrodes 12 and 13 was confirmed.

Figure 18:
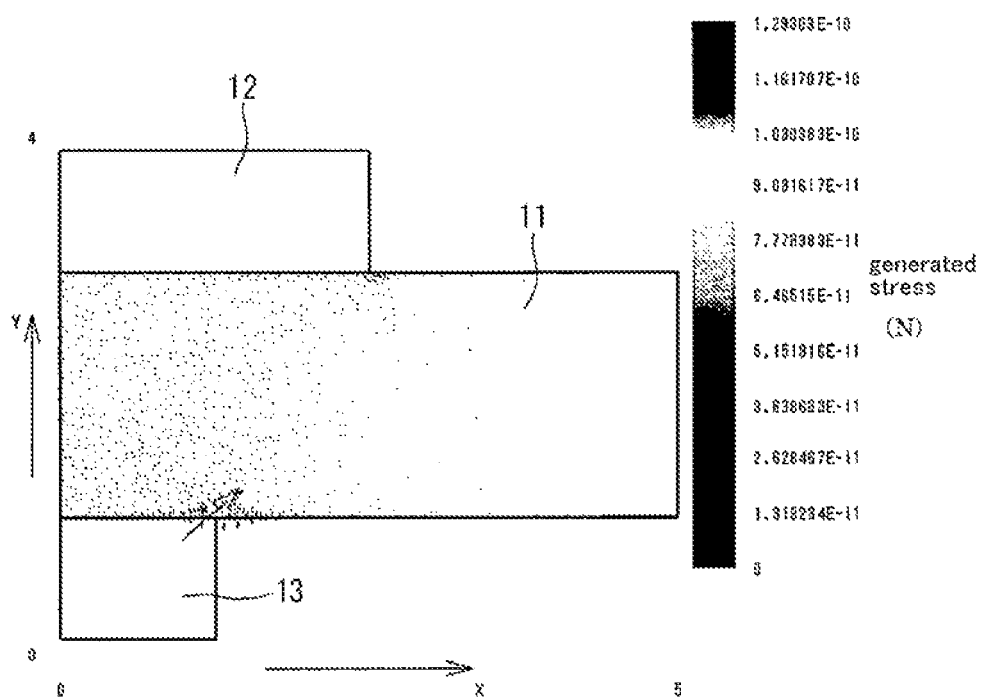
FIG. 18 is a schematic view showing a stress vector distribution in FIG. 16.
Figure 19:
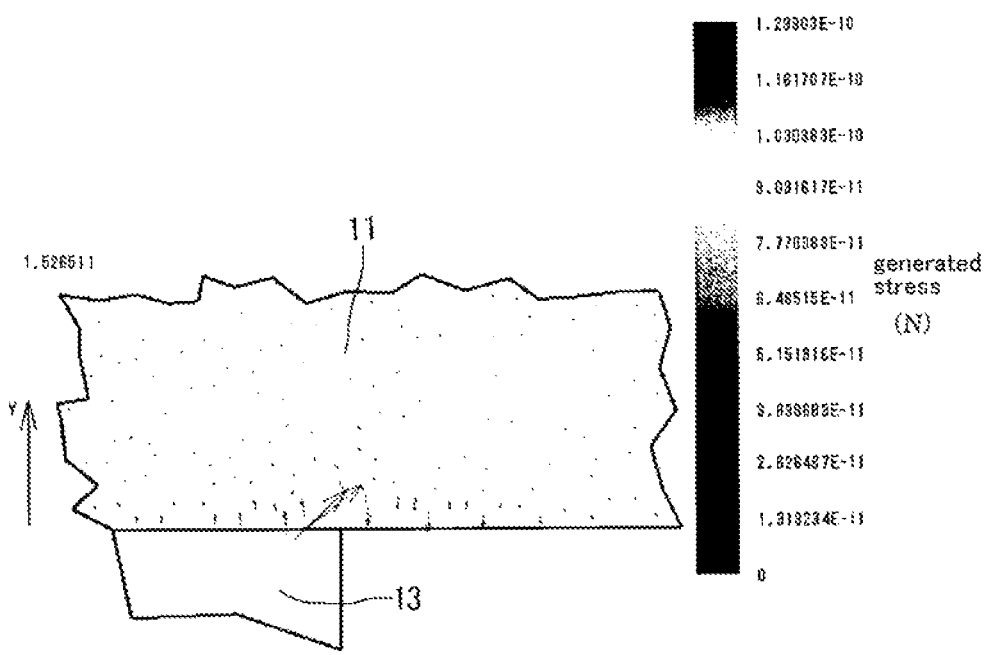
FIG. 19 is an enlarged cross section showing principal parts of FIG. 18.

In addition, the Maxwell stress was measured from the electric field vector distribution shown in FIGS. 16 and 17 and in the schematic views of stress vector distribution in FIGS. 18 and 19, the maximum stress was $1.3 \times 10^{-10}$ N and the place where the maximum stress was generated was the outer circumferential section of the electrode 13. With the portion of the polymer material not in contact with the electrode 13 as the place where the maximum stress was generated, as shown in the diagram of vectors of the generated stress in FIG. 25(b), it was confirmed that the distribution of the generated stress existed in the direction of bending the electro stimuli-responsive polymer material 11 to the low-potential side, with the outer peripheral portion of the electrode 13 on the low-potential side as the fulcrum.

It was confirmed from the simulation results described above that both the maximum electric field intensity value and the maximum stress value of the power driver 11 were larger than those of the shaft-sealing body 1. Therefore, by means of the maximum electric field intensities and the maximum stresses, at the time of the actual deformation, the shaft-sealing body 1 was bent in the state shown in FIG. 26(a), whereas the power driver 11 was bent in the state shown in FIG. 26(b). Thus, the power driver 11 of the present invention was bent more largely than the shaft-sealing body 1 and the amount of the displacement thereof became larger.

EXAMPLE 3

Furthermore, by configuring a polymer actuator having a structure different from that in Example 2 and applying voltage to the polymer actuator, the distribution of the electric field vectors at the time of the voltage application was analyzed by simulation in the same manner as in Example 2. In this example, as shown in FIG. 27, an electro stimuli-responsive polymer material (power driver) 81 is formed in the shape of a hollow ring having an outer circumferential surface formed in a substantially hemispherical shape. The power driver 81 has the upper and lower sides thereof provided with upper and lower electrodes 82 and 83, respectively. The portion of the power driver 81 in contact with the upper electrode 82 is a plane section on the upper side of the power driver and the portions thereof brought into contact with the lower electrode 83 are a plane section on the lower side thereof and a bent surface section on the inner circumferential side thereof.

Figure 28:
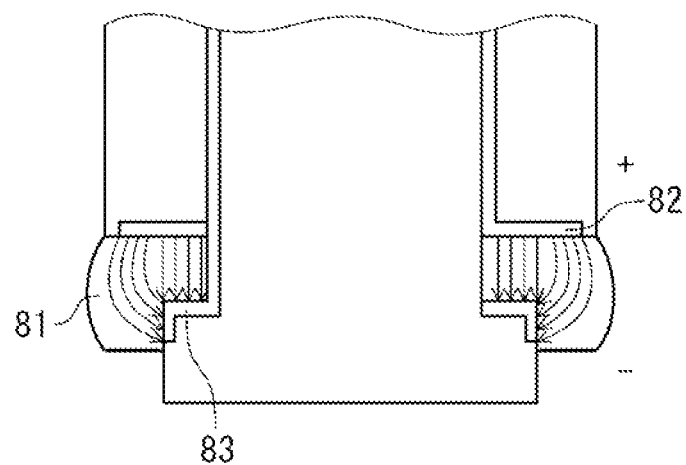
FIG. 28 is a schematic view showing a state in which stress spectra of the polymer material of FIG. 27 have been generated.
Figure 29:
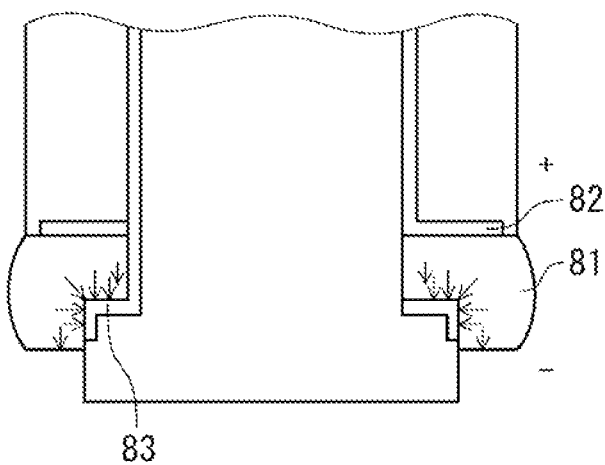
FIG. 29 is a schematic view showing a state in which stress spectra of the polymer material in FIG. 27 have been generated.

When external electro stimuli have been applied from the electrodes 82 and 83 to the power driver 81, the distribution of the electric field vectors is generated as shown in FIG. 28. Stress vectors generated at that time are in the state shown in the diagram of FIG. 29. As shown by arrows in FIG. 29, stress in a diameter-reducing direction is generated in the polymer material 81 at the time of the application of electric fields and stress in an axially elongating direction is generated therein. As shown in FIGS. 28 and 29, therefore, the polymer material 81 is effectively deformed in a direction of sealing a fluid to prevent leakage of the fluid. As a result of the deformation, when a polymer actuator having the power driver 81 attached thereto has been applied to a drive source, such as a valve, it is possible to bring the outer circumferential side of the power driver 81 into contact with the wall surface of a flow passage to heighten a sealing force at the time of valve closing and control a flow rate from a large-level flow rate to a small-level flow rate. In addition, when the polymer actuator having the power driver 81 attached thereto has been applied to a shaft-sealing device, it is possible to bring the outer circumferential side of the power driver 81 into contact with a shaft-sealing part to control the amount of leakage of a fluid and control a small amount of leakage in a shaft-sealed state. Furthermore, since this configuration has the electrodes 82 and 83 built in the section constituting the polymer actuator, the electrodes 82 and 83 are prevented from being exposed to the side of the fluid.

EXPLANATION OF REFERENCE NUMERALS

10: actuator body
11: power driver
11a: forward end face
12, 13: electrodes
14: deposited electrode
21: body
23: drive part
33, 34: flow passages
35: valve seat
37: seating face

The invention claimed is:

1. A polymer actuator comprising:
a power driver deformed upon receiving external electro stimuli; and
electrodes disposed on upper and lower surface sides of the power driver in an opposite manner for applying positive and negative external electro stimuli to the power driver in a planar fashion;
wherein the electrodes have different stimuli application regions to have different electrical field distributions for causing distribution of stress generated in the power driver to be eccentrically located on one of positive and negative sides, thereby bending and deforming the power driver onto a side on which the opposite stimuli application regions do not exist; and
wherein one of the electrodes is provided with an inclined surface that separates from the power driver in a spreading manner in a diametrical direction of an outer end of the power driver.

2. The polymer actuator according to claim 1, wherein one of the electrodes disposed on the upper and lower surface sides of the power driver, which one of the electrode has a wide stimuli application region, constitutes a flexible deposited electrode that is deformed integrally with the power driver in a course of the power driver being bent and deformed for applying external electro stimuli to the power driver.

3. The polymer actuator according to claim 1, wherein the power driver is formed of an electro stimuli-responsive polymer material that returns to an original position when stopping application of external electro stimuli and, when the external electro stimuli have been applied, causes a section thereof other than a section thereof having received the external electro stimuli to be bent and deformed.

4. A valve using the polymer actuator according to claim 1, the valve comprising a body having plural flow passages, wherein the polymer actuator is disposed within the body as a valving element that opens or closes the flow passages or controls a flow rate.

5. A shaft-sealing structure using the polymer actuator according to claim 1, the shaft-sealing structure comprising a main body and a shaft-sealing part formed in the main body, wherein the polymer actuator is applied to the shaft-sealing part to allow a fluid-leaking phenomenon to occur through deformation of the polymer actuator.

6. A polymer actuator comprising:
a power driver deformed upon receiving external electro stimuli; and
fixed electrodes fixed to upper and lower surface sides of the power driver in an opposite manner for applying positive and negative external electro stimuli to the power driver in a planar fashion;
wherein the fixed electrodes have different stimuli application regions to have different electrical field distributions for causing distribution of stress generated in the power driver to be eccentrically located on one of positive and negative sides, thereby bending and deforming the power driver onto a side on which the opposite stimuli application regions do not exist; and wherein one of the fixed electrodes is provided with an inclined surface that separates from the power driver in a spreading manner in a diametrical direction of an outer end of the power driver.

7. The polymer actuator according to claim 6, further comprising a flexible deposited electrode vapor-deposited at a relative or irrelative position between the power driver and one of the fixed electrodes that has a wide stimuli application region and deformed integrally with the power driver in a course of the power driver being bent and deformed to apply external electro stimuli to the power driver.

8. The polymer actuator according to claim 6, wherein the power driver is formed of an electro stimuli-responsive polymer material that returns to an original position when stopping application of external electro stimuli and, when the external electro stimuli have been applied, causes a section thereof other than a section thereof having received the external electro stimuli to be bent and deformed.

9. A valve using the polymer actuator according to claim 6, with the valve comprising a body having plural flow passages, wherein the polymer actuator is disposed within the body as a valving element that opens or closes the flow passages or controls a flow rate.

10. A shaft-sealing structure using the polymer actuator according to claim 6, the shaft-sealing structure comprising a main body and a shaft-sealing part formed in the main body, wherein the polymer actuator is applied to the shaft-sealing part to allow a fluid-leaking phenomenon to occur through deformation of the polymer actuator.

* * * * *

UNITED STATES PATENT AND TRADEMARK OFFICE
CERTIFICATE OF CORRECTION

| | |
|---|---|
| PATENT NO. | : 8,413,953 B2 |
| APPLICATION NO. | : 12/866123 |
| DATED | : April 9, 2013 |
| INVENTOR(S) | : Aoki et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 371 days.

Signed and Sealed this
Twenty-eighth Day of October, 2014

Michelle K. Lee
*Deputy Director of the United States Patent and Trademark Office*